US012772518B1

(12) United States Patent
Pandya et al.

(10) Patent No.: US 12,772,518 B1
(45) Date of Patent: Oct. 20, 2026

(54) NANORIBBON TRANSISTOR SOURCE AND DRAIN WITH UNIFORM NUCLEATION

(71) Applicant: Intel Corporation, Santa Clara, CA (US)

(72) Inventors: Shishir Pandya, Hillsboro, OR (US); James Kally, Hillsboro, OR (US); Robert Ehlert, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 571 days.

(21) Appl. No.: 18/333,809

(22) Filed: Jun. 13, 2023

(51) Int. Cl.
*H10D 62/13* (2025.01)
*H10D 30/01* (2025.01)
*H10D 30/43* (2025.01)
*H10D 30/67* (2025.01)
*H10D 62/10* (2025.01)
*H10D 64/01* (2025.01)

(52) U.S. Cl.
CPC ......... *H10D 62/151* (2025.01); *H10D 30/014* (2025.01); *H10D 30/43* (2025.01); *H10D 30/6735* (2025.01); *H10D 62/121* (2025.01); *H10D 64/017* (2025.01); *H10D 64/018* (2025.01)

(58) Field of Classification Search
CPC .. H10D 62/151; H10D 62/121; H10D 30/014; H10D 30/43; H10D 30/6735; H10D 64/017; H10D 64/018
See application file for complete search history.

(56) References Cited

U.S. PATENT DOCUMENTS

| | | | | |
|---|---|---|---|---|
| 12,382,716 | B2 * | 8/2025 | Jeong | H10D 62/151 |
| 2022/0223711 | A1 * | 7/2022 | Kim | H10D 30/6757 |
| 2022/0336614 | A1 * | 10/2022 | Wang | H10D 30/43 |
| 2023/0317791 | A1 * | 10/2023 | Lin | H10D 62/121<br>257/401 |
| 2023/0420506 | A1 * | 12/2023 | Lee | H10D 62/405 |
| 2024/0055485 | A1 * | 2/2024 | Chang | H01L 21/28518 |
| 2024/0387735 | A1 * | 11/2024 | More | H10D 62/405 |
| 2025/0301738 | A1 * | 9/2025 | Li | H10D 84/85 |

* cited by examiner

*Primary Examiner* — Dao H Nguyen
(74) *Attorney, Agent, or Firm* — Akona IP PC

(57) ABSTRACT

Described herein are nanoribbon transistors with a uniform layer of silicon material epitaxially deposited on the ends of the channel regions for the source and drain regions. The silicon is deposited over both the nanoribbon ends and dimple spacers between adjacent nanoribbons. The material may be deposited using a multicycle deposition and etch process, in which both crystalline and amorphous silicon are deposited in a low-selectivity process, and amorphous silicon is removed between deposition steps.

20 Claims, 19 Drawing Sheets

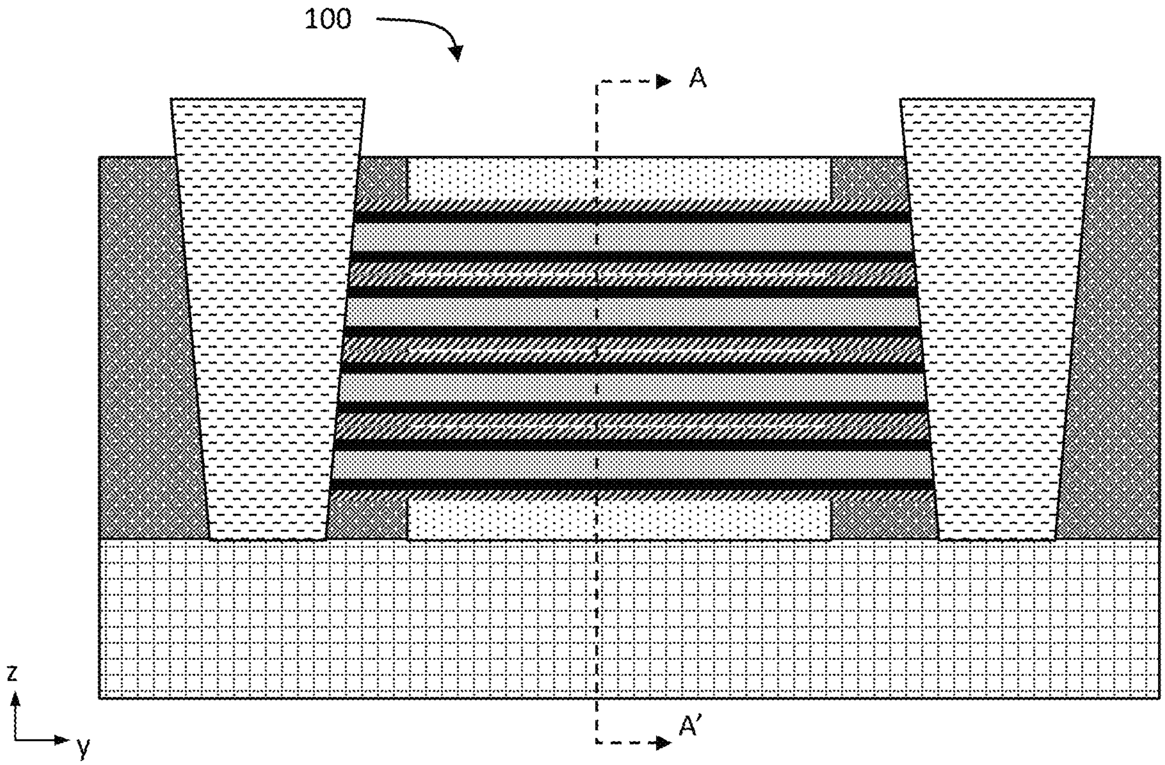
FIG. 1A
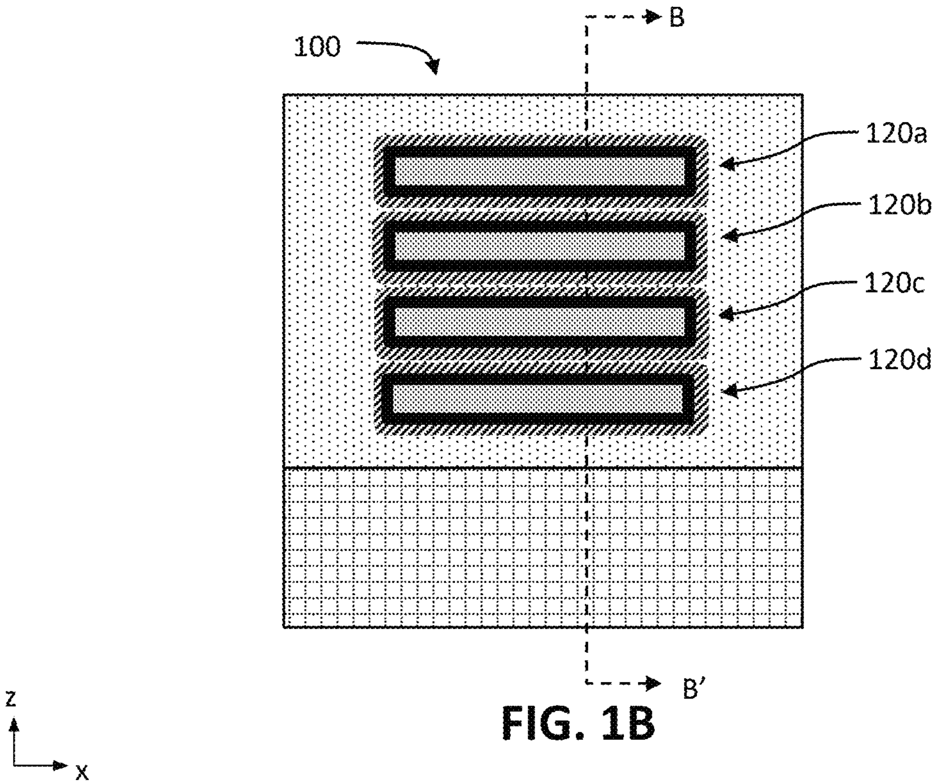
FIG. 1B
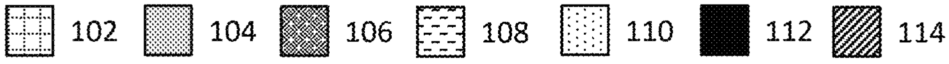

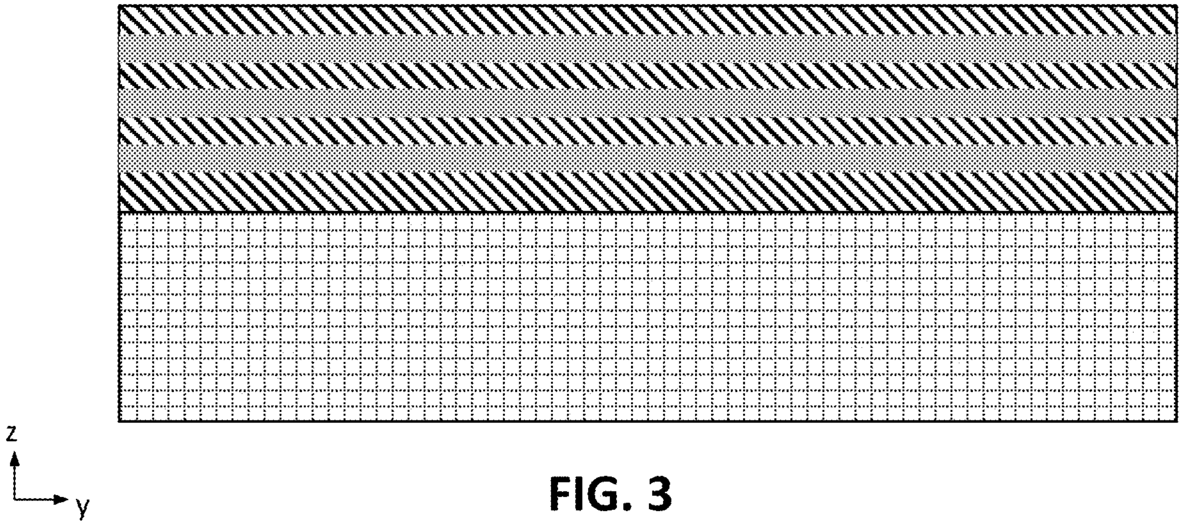
FIG. 3
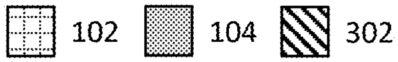

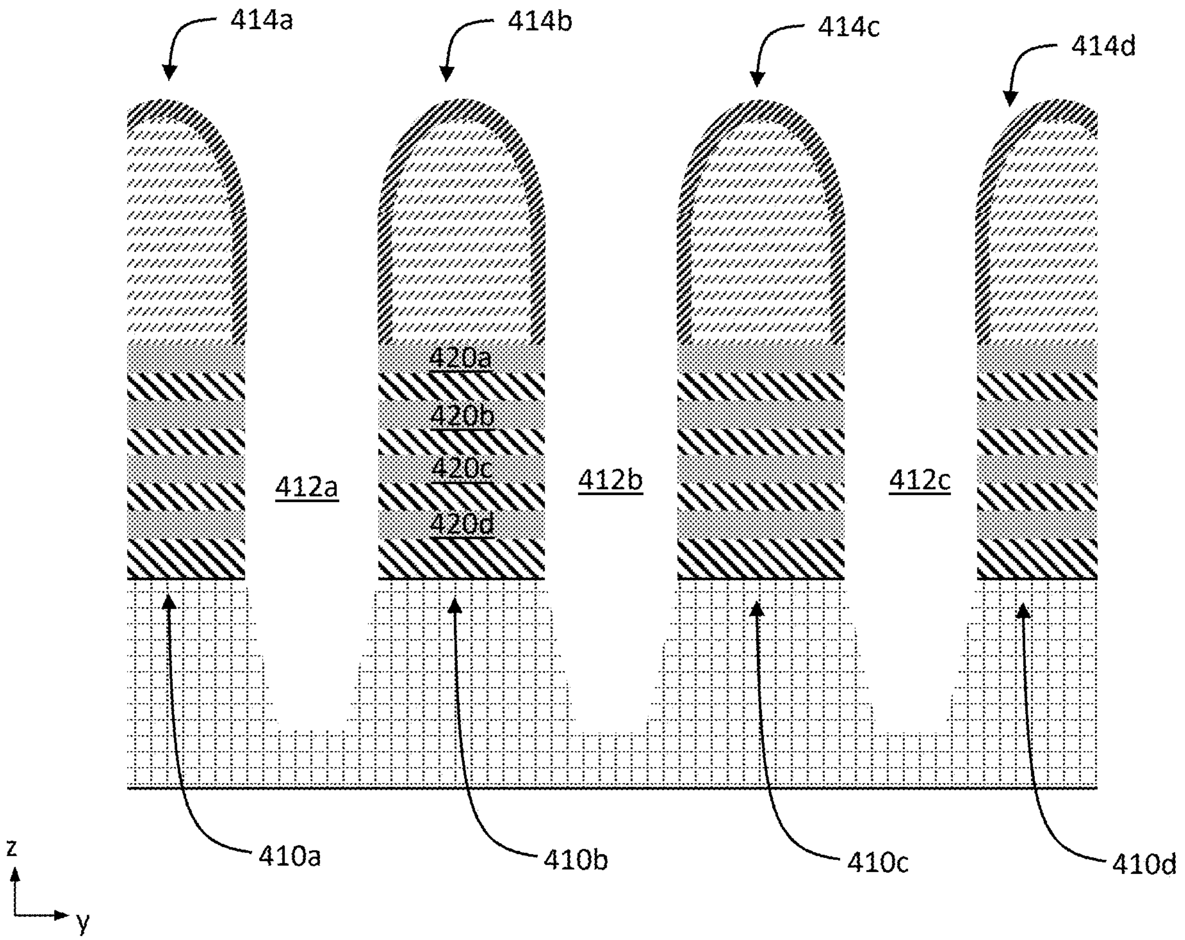
FIG. 4

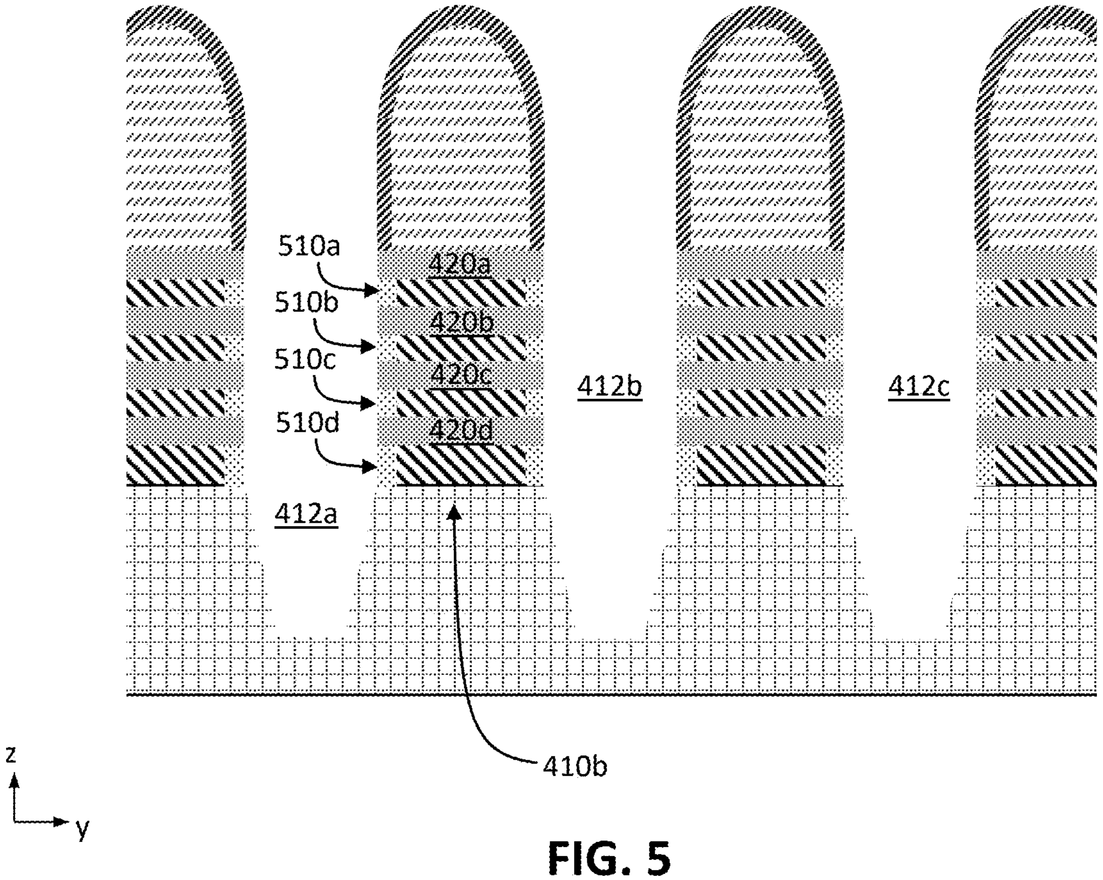
FIG. 5
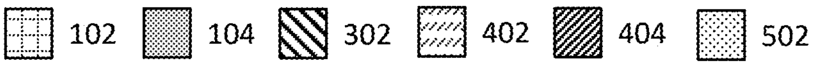

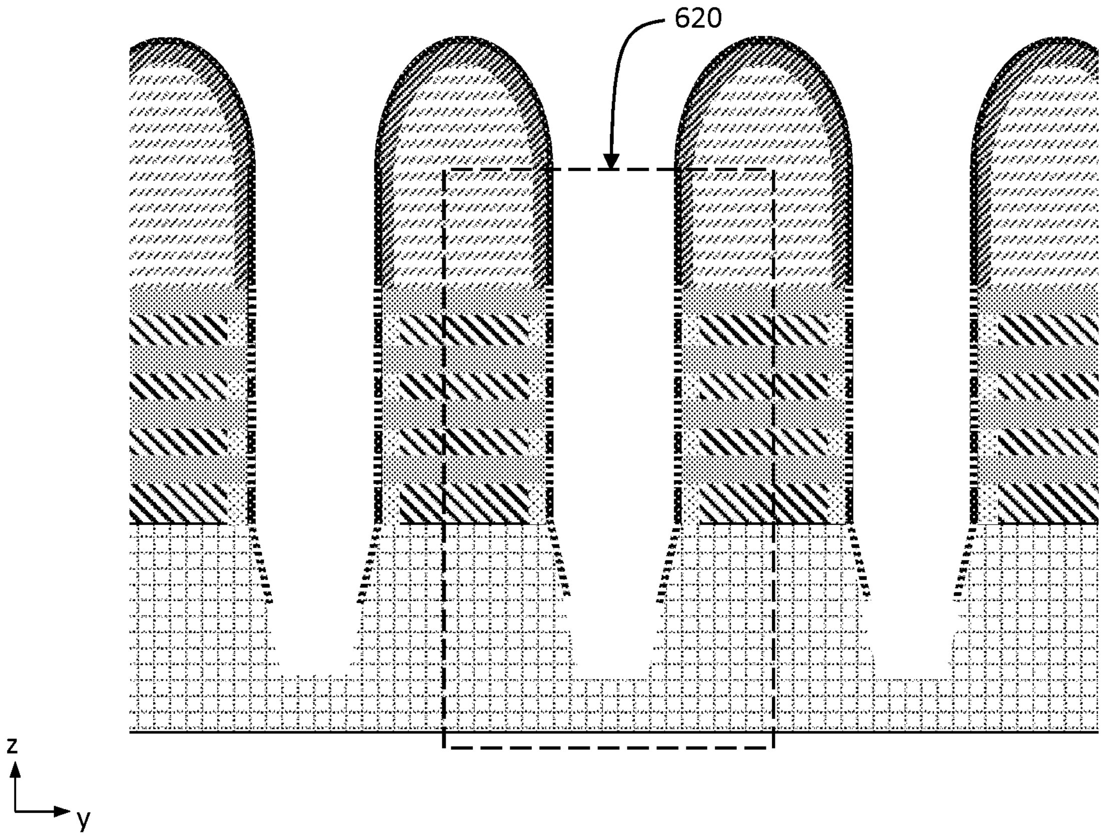
FIG. 6A

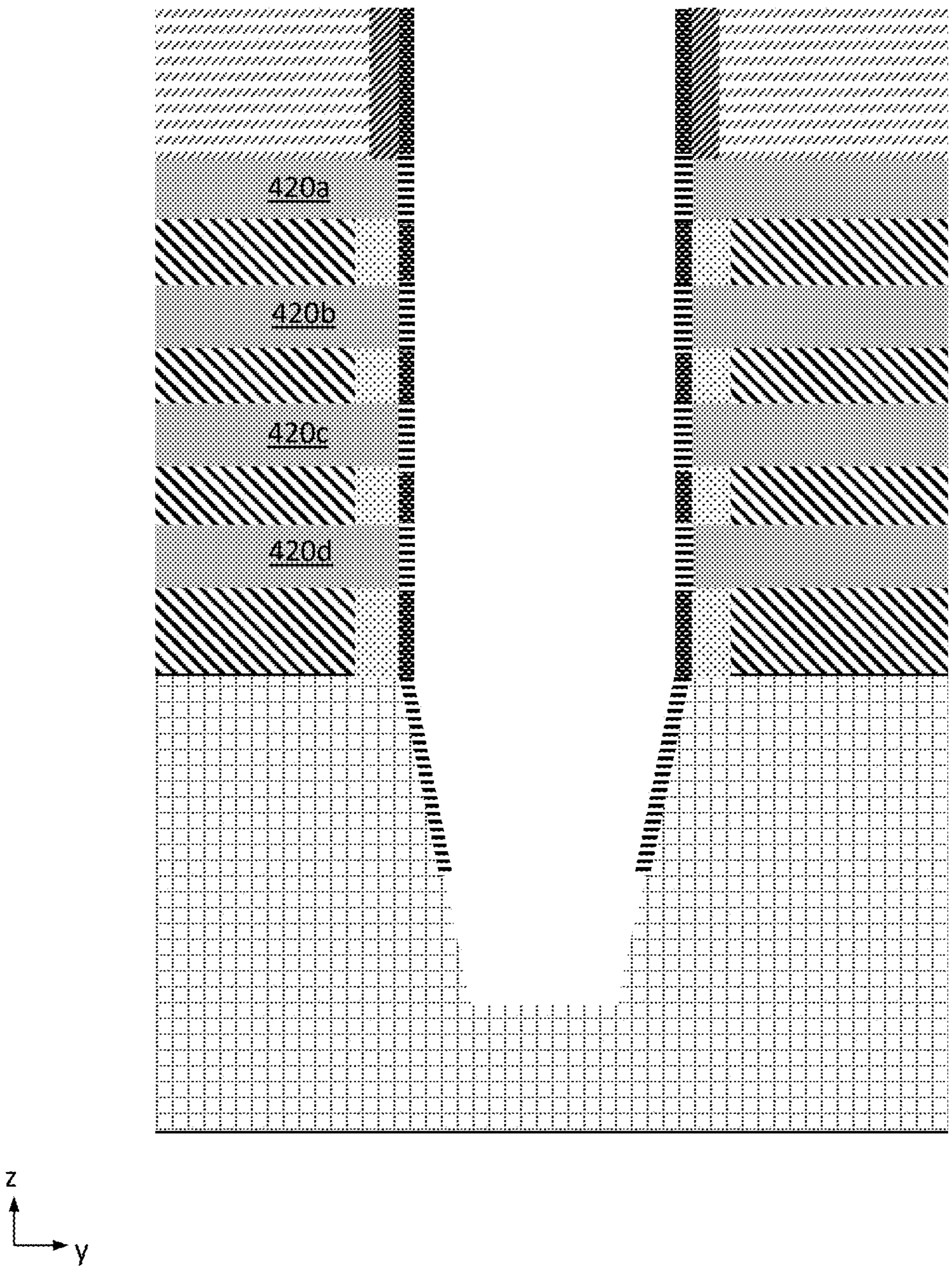
FIG. 7

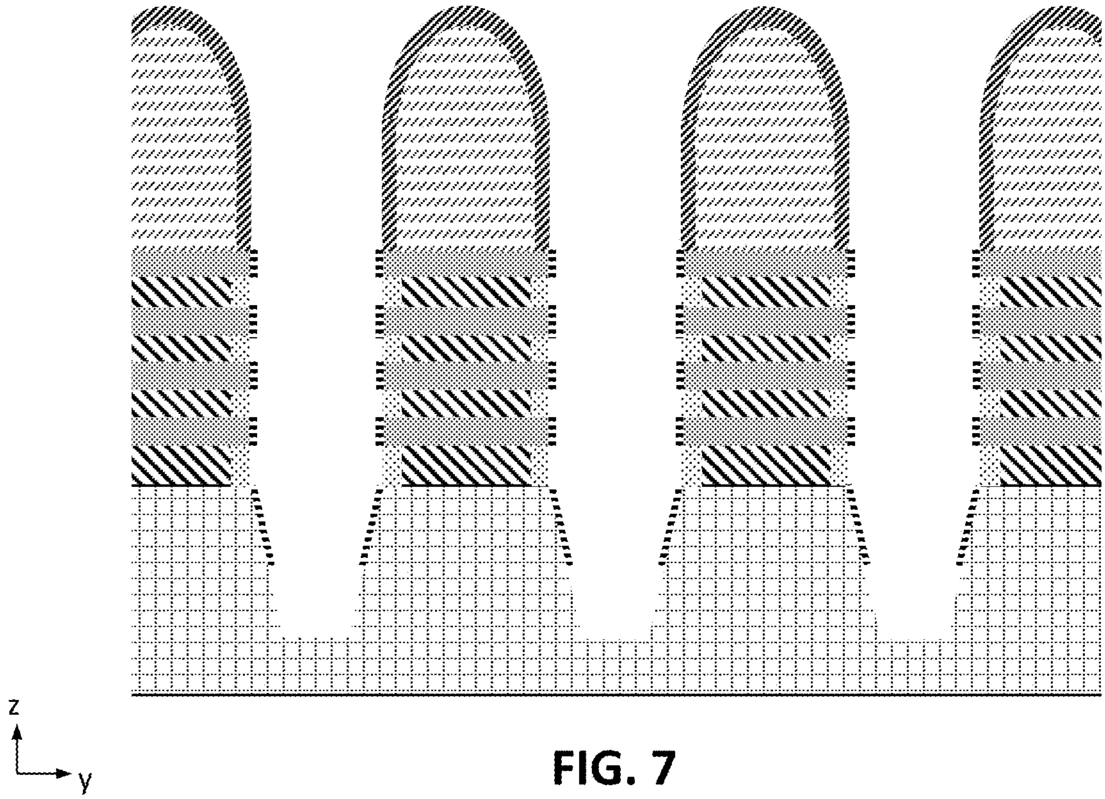
FIG. 7

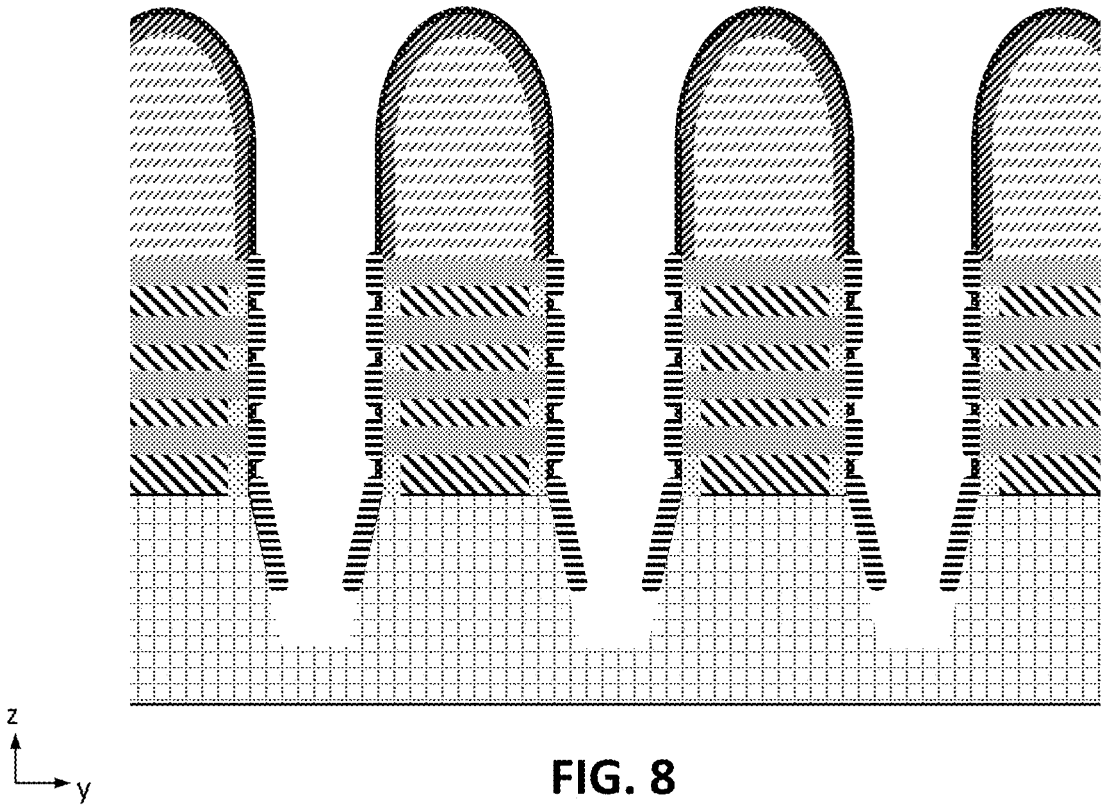
FIG. 8

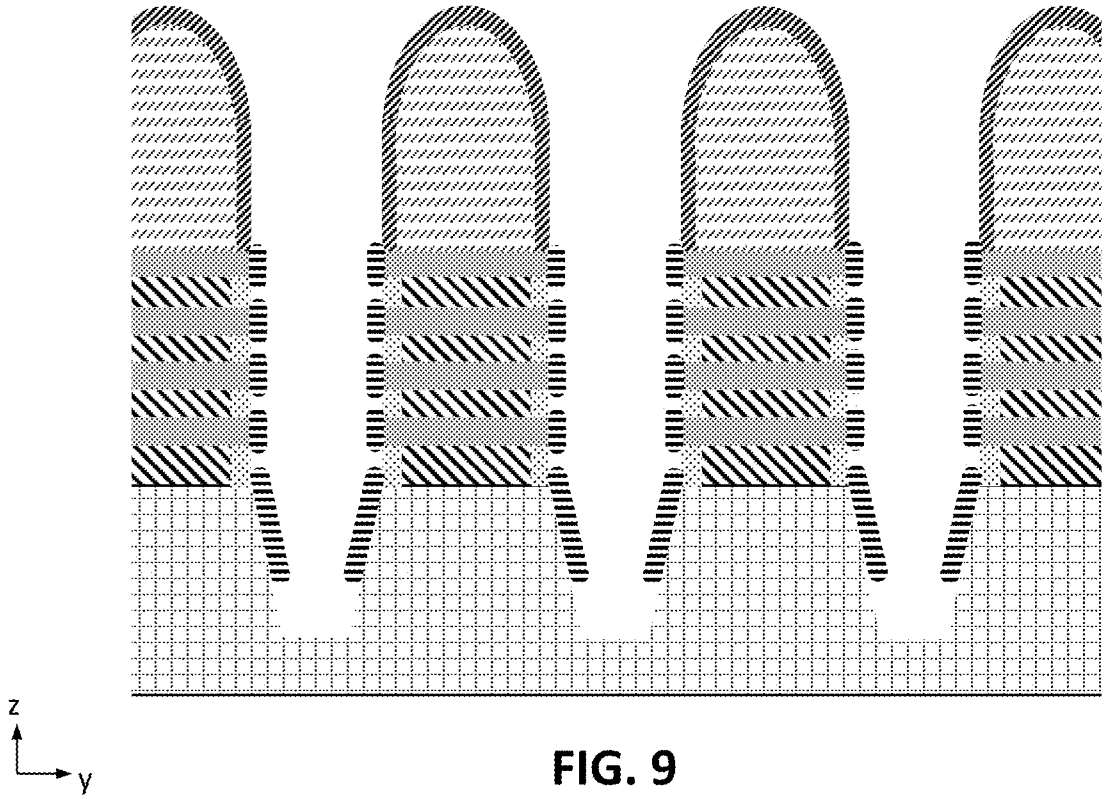
FIG. 9

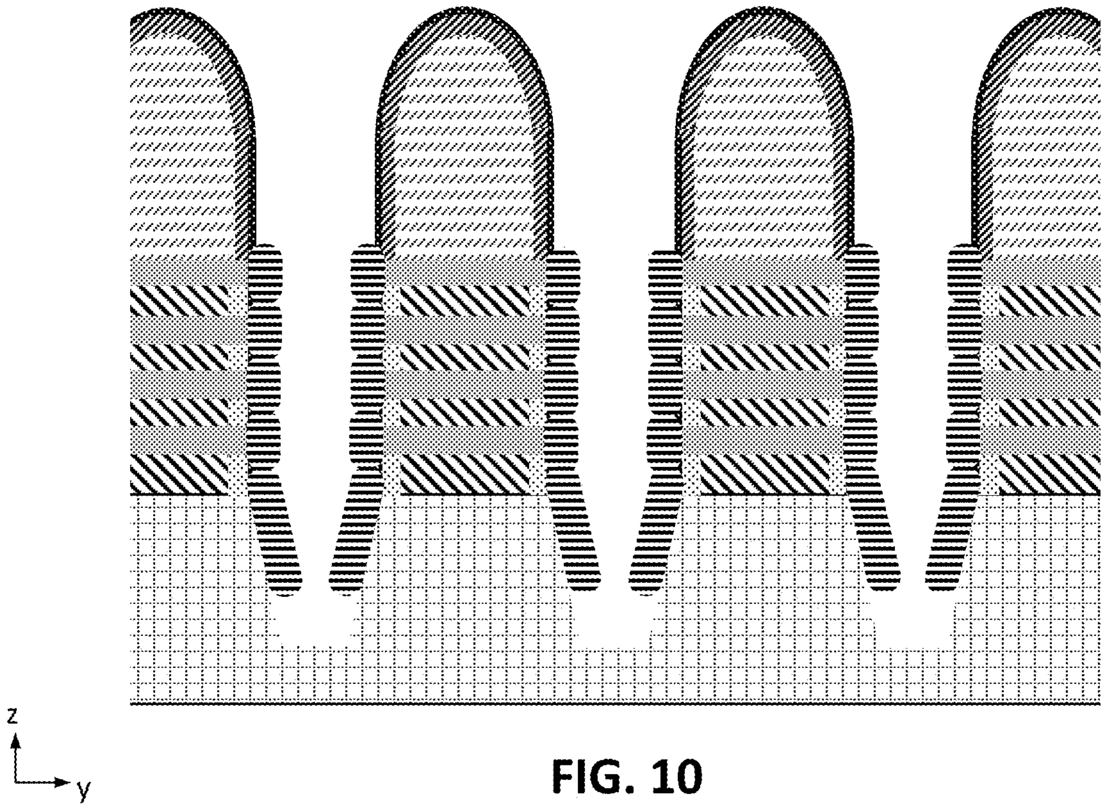
FIG. 10

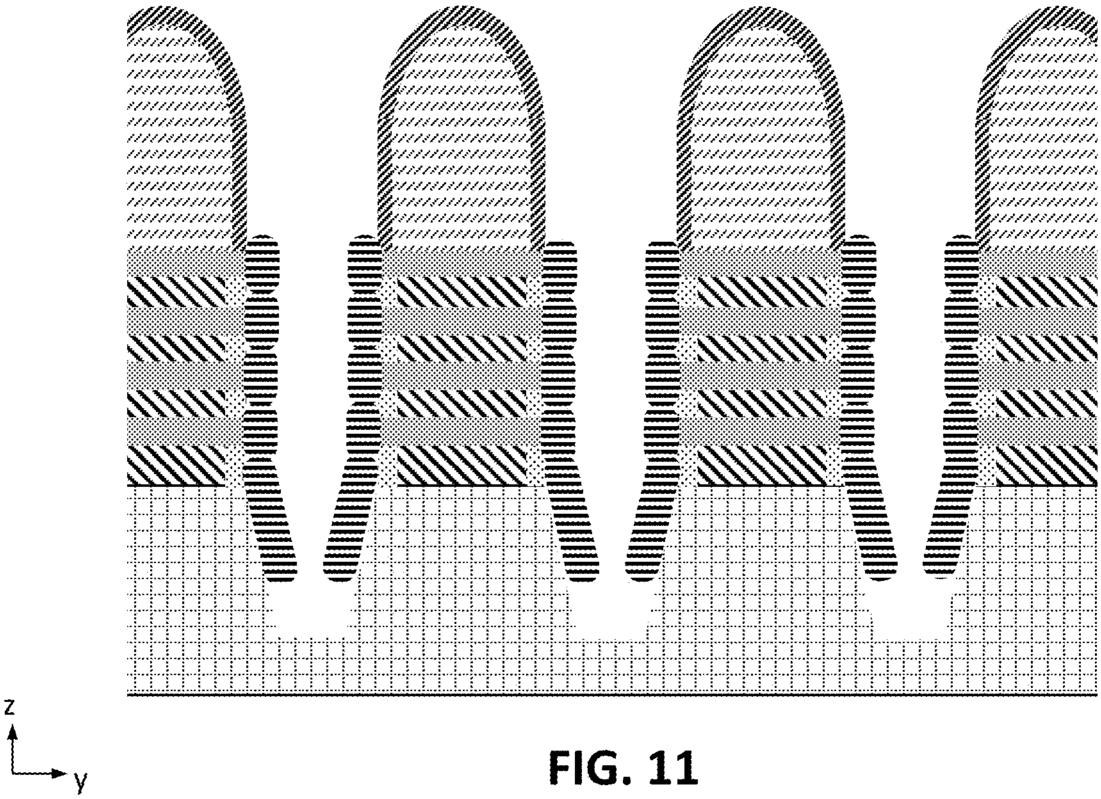
FIG. 11

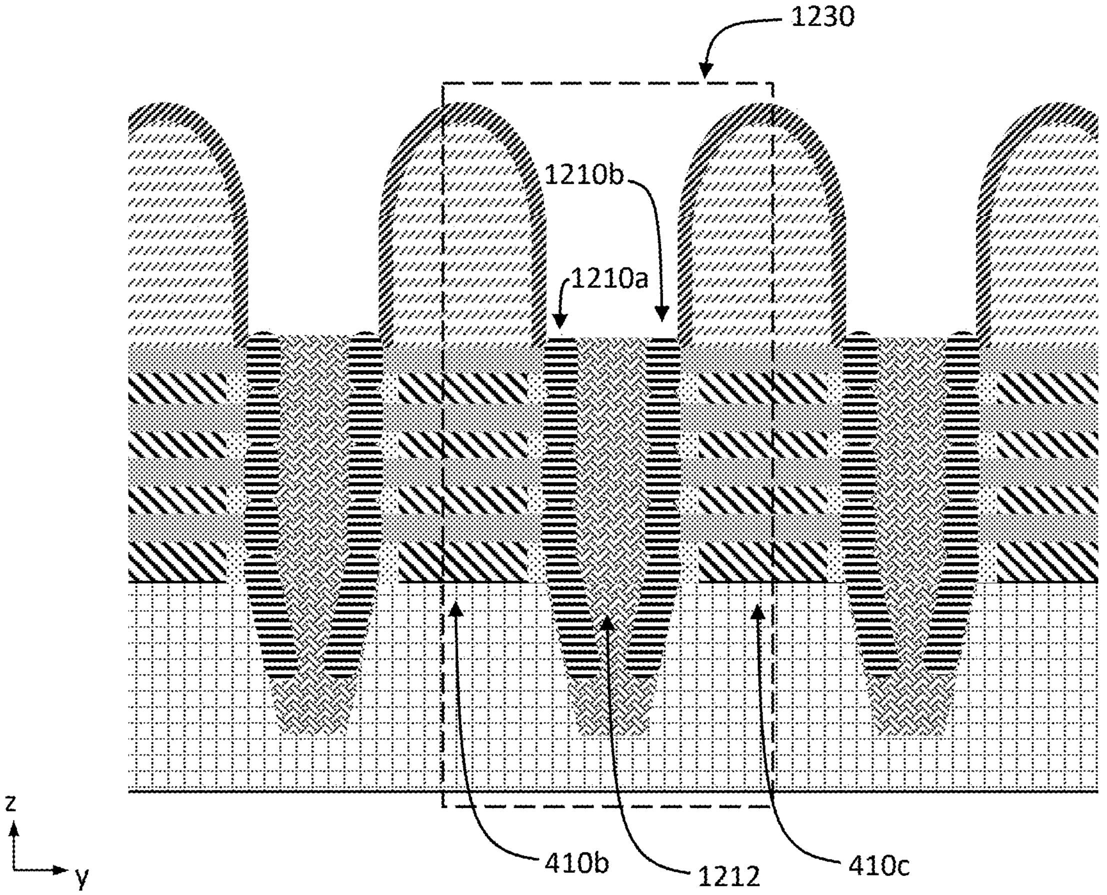
FIG. 12

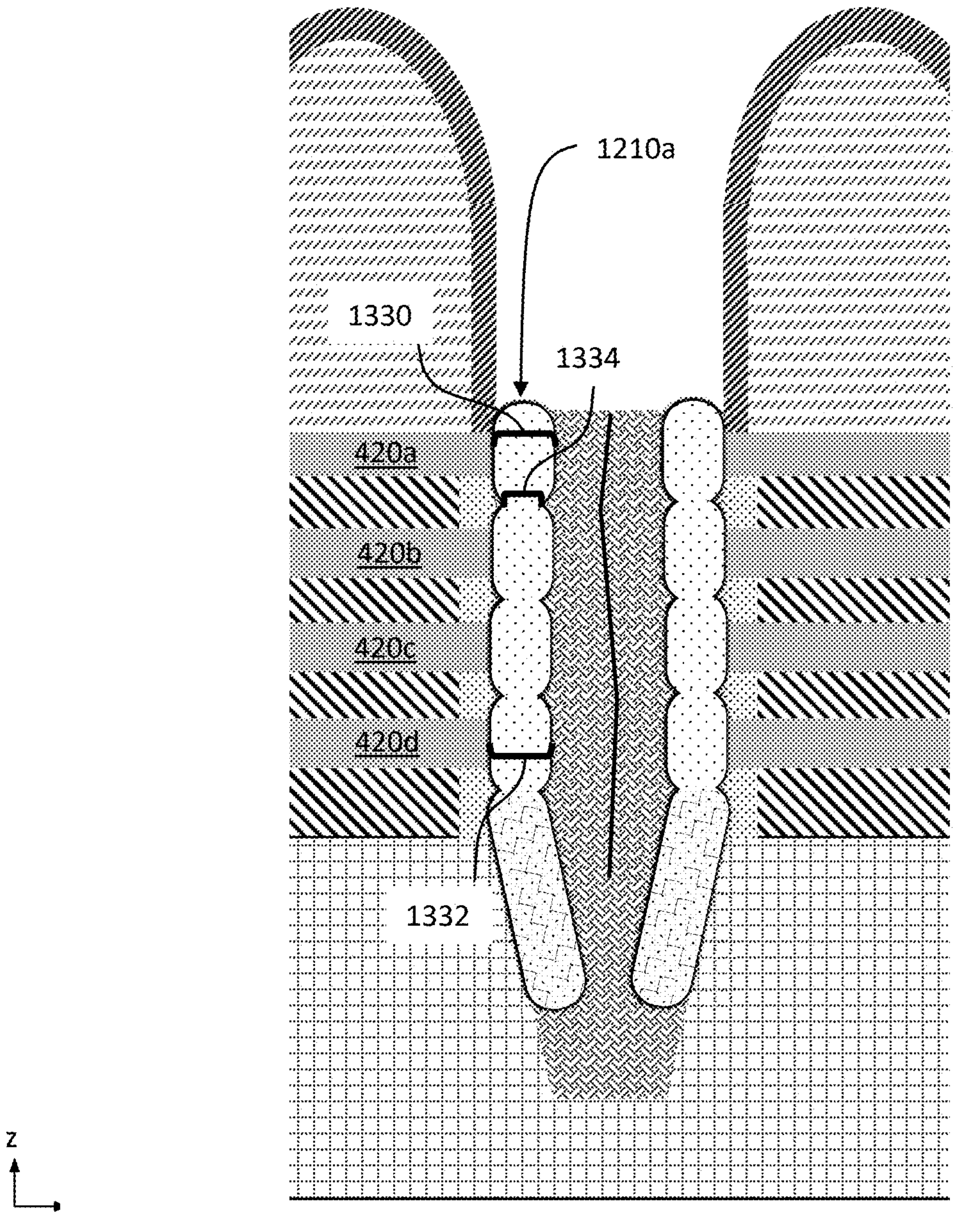
FIG. 13

NANORIBBON TRANSISTOR SOURCE AND DRAIN WITH UNIFORM NUCLEATION

TECHNICAL FIELD

This disclosure relates generally to the field of integrated circuit (IC) structures and devices, and more specifically, to nanoribbon-based transistors with uniform nucleation of N-type sources and drains.

BACKGROUND

Non-planar transistors are three-dimensional electronic devices that deviate from a traditional flat transistor design. Compared to planar transistors, non-planar transistors can provide improved control over current flow, reduced leakage, and enhanced performance, making it a key technology for smaller, faster, and more energy-efficient electronic devices. Examples of non-planar transistors include fin-shaped field effect transistors, referred to as FinFETs, and gate-all-around (GAA) transistors. Gate all around (GAA) transistors, also referred to as surrounding-gate transistors, have a gate material that surrounds a channel region on all sides. GAA transistors may be nanoribbon-based or nanowire-based. In a nanoribbon transistor, a gate stack that may include one or more gate electrode materials and a gate dielectric may be provided around a portion of an elongated semiconductor structure called "nanoribbon", forming the gate stack on all sides of the nanoribbon. A source region and a drain region are provided on the opposite ends of the nanoribbon(s) and on either side of the gate stack, forming, respectively, a source and a drain of the nanoribbon transistor.

In some device fabrication processes, doped N-type semiconductor materials, such as doped silicon, are deposited between adjacent transistors to form the N-type sources and drains. A first layer of a lower dopant level may epitaxially grown directly over the nanoribbons, and a second layer with a higher dopant concentration is then deposited. It can be difficult to control the growth rate of the first epitaxial layer, e.g., to achieve uniformity in thickness across multiple nanoribbons at different heights in a transistor. This lack of uniformity can impede deposition of the second, higher-doped material, and can lead to shorting of the S/D regions between transistors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a cross-section across a nanoribbon-based transistor showing the source, gate, and drain, according to some embodiments of the present disclosure.

FIG. 1B is a cross-section of the nanoribbon-based transistor through the plane AA' in FIG. 1A, according to some embodiments of the present disclosure.

FIG. 3 is a cross-section of layers of alternating materials for forming nanoribbons, according to some embodiments of the present disclosure.

FIG. 4 is a cross-section illustrating regions etched for forming sources and drains, according to some embodiments of the present disclosure.

FIG. 5 is a cross-section illustrating the deposition of spacers between adjacent nanoribbons, according to some embodiments of the present disclosure.

FIG. 6A is a cross-section illustrating deposition of a first layer of crystalline and amorphous silicon in the source/drain region, according to some embodiments of the present disclosure.

FIG. 7 is a cross-section illustrating a first selective etch of the amorphous silicon, according to some embodiments of the present disclosure.

FIG. 8 is a cross-section illustrating deposition of a second layer of crystalline and amorphous silicon over the first layer of crystalline silicon, according to some embodiments of the present disclosure.

FIG. 9 is a cross-section illustrating a second selective etch of the amorphous silicon, according to some embodiments of the present disclosure.

FIG. 10 is a cross-section illustrating deposition of a third layer of crystalline and amorphous silicon over the second layer of crystalline silicon, according to some embodiments of the present disclosure.

FIG. 11 is a cross-section illustrating a third selective etch of the amorphous silicon, according to some embodiments of the present disclosure.

FIG. 12 is a cross-section illustrating growth of a second material for the sources and drains, according to some embodiments of the present disclosure.

FIG. 13 is an enlarged view of a portion of FIG. 12, according to some embodiments of the present disclosure.

DETAILED DESCRIPTION

Overview

Figure 2:
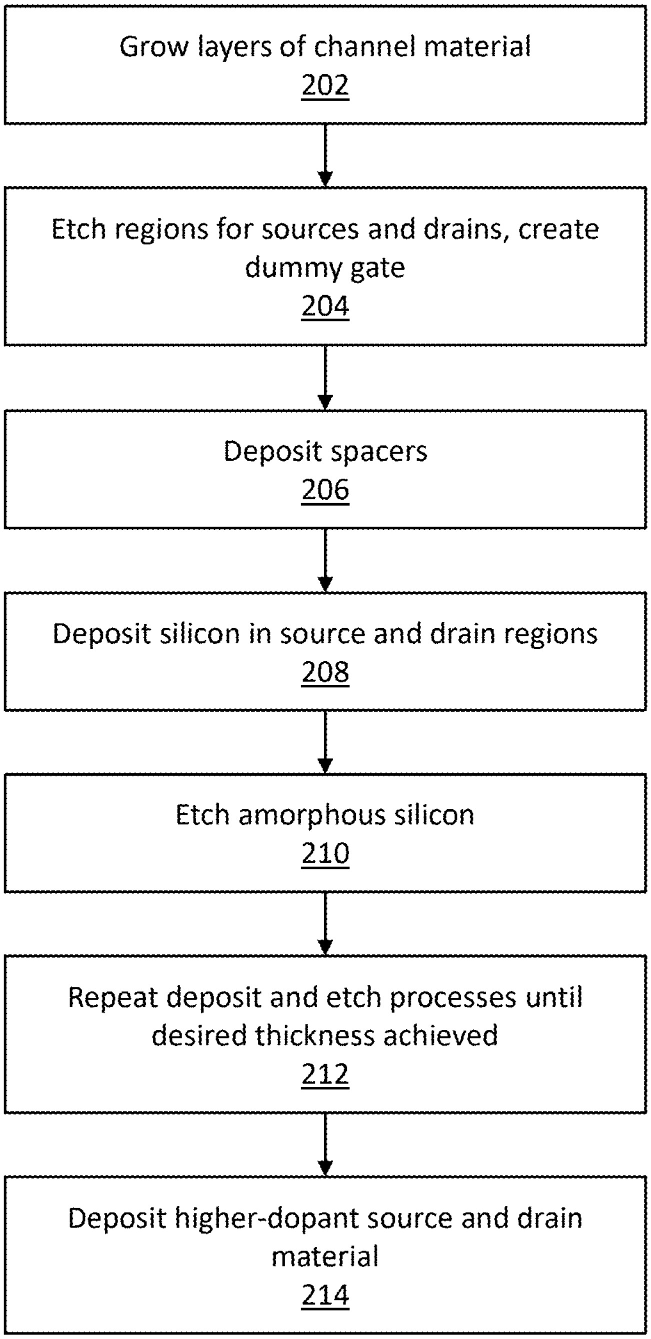
FIG. 2 is a flow diagram of a process for fabricating source and drain regions of a nanoribbon-based transistor, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Described herein are IC devices that include non-planar transistors, such as nanoribbon-based transistors or nanowire-based transistors, having uniform nucleation layers of source and drain material across the height of a device (e.g., across multiple nanoribbons at different heights). The N-type source and drain material may be epitaxially grown on either side of the transistor channel material in a multi-cycle deposition and etch process. This process provides relatively uniform nucleation across the ends of the nanoribbons as well as over the dielectric spacers between the nanoribbons. Each deposition cycle uses a low-selectivity deposition chemistry, which results in crystalline deposits over crystalline materials (e.g., ends of the silicon nanoribbons) and amorphous deposits over non-crystalline materials. The etch cycle removes the non-crystalline deposits. Over multiple cycles, the crystalline deposits over the ends of the nanoribbons expand and cover the areas over the dielectric spacers between the ends of the nanoribbon. This results in a substantially uniform layer of crystalline material in the source and drain regions.

Non-planar transistors provide several advantages over planar transistor architectures. For example, non-planar transistors provide improved electrostatic transistor control and faster transistor speeds relative to other transistor architectures. For certain applications, nanoribbon-based channels are particularly advantageous, providing increased drive current at smaller scales relative to other non-planar architectures.

Transistors typically include a gate stack coupled to a semiconductor channel, which may be a nanoribbon or a stack of nanoribbons. A gate stack includes a gate electrode and a gate dielectric, with the gate dielectric formed between the gate electrode and the channel material. In a nanoribbon transistor, the gate dielectric is formed around each nanoribbon, and the gate electrode is formed over and around the gate dielectric, including in spaces between adjacent nanoribbons in the stack. A source region is formed at one end of the nanoribbons, and a drain region is formed at the opposite end of the nanoribbons, thus realizing a three-terminal device.

The source and drain regions may be formed from doped semiconductors, such as doped silicon. The silicon may be epitaxially grown over the exposed ends of the nanoribbons. In some processes, a selective deposition process is used to deposit the source and drain material only on the ends of the nanoribbons, and not on other regions of the device. A current approach to achieve selectivity in a high-temperature silicon deposition process relies on a balance of silicon-based deposition precursors and chlorine-based etch precursors co-flowed into a chemical vapor deposition (CVD) chamber. The selective deposition process results in non-uniform incubation times across different nanoribbons. Some nanoribbons begin deposition quickly, while other nanoribbons are delayed. As the deposition continues, the gap in incubation time manifests as non-uniform deposition thickness across different nanoribbons, e.g., at nanoribbons of different heights and/or nanoribbons of different transistors.

To achieve adequate thickness across multiple nanoribbons, the deposition process can result in certain areas of growth being thicker than desired. For example, in a high-selectivity process for depositing doped silicon for the first source/drain layer, growth begins on the (110)-Si surface and facets into a (111)-surface, forming triangular nubs over the ends of each nanoribbon. This results in poor coverage over the spacers. At a later stage of the process, a higher-conductivity source/drain material (e.g., silicon with a higher dopant concentration) is filled over the first layer of doped silicon. Having this higher-dopant material directly against the dielectric spacer can lead to shorts between the source/drain and a gate formed on the other side of the spacer.

To mitigate this problem, previous approaches focused on increasing the thickness of the nucleation layer to ensure the nanoribbons and spacers are covered with a lower-dopant concentration nucleation layer. However, too thick of this nucleation layer results in a significant reduction in the volume of source/drain available to be filled by the second higher-dopant concentration layer. The reduction in the volume of the main fill results in a higher bulk resistance and a higher contact resistivity with a silicide contact. In addition, thick epitaxial growth over the nanoribbon ends can lead to misshapen source and drain regions, which can reduce device performance. For example, if two adjacent transistors both have thick regions of epitaxial growth, they may form a short between the transistors, reducing yield.

Reducing the selectivity of the epitaxial deposition process can provide greater uniformity across the nanoribbons and prevent misshapen and overly thick growth of the source and drain regions. The selectivity can be reduced by adjusting the ratio of silicon to chlorine in the deposition process. However, reducing the selectivity can result in the growth of amorphous silicon on dielectric surfaces, which is undesirable.

As described herein, a multicycle epitaxial deposition and etch process provides substantially uniform layers of source/drain material in the source and drain regions, over the ends of the nanoribbons and dielectric spacers. The process may reduce the overall thickness of the nucleation layer compared to prior processes, since the lower selectivity ensures that an adequately thick layer of source/drain material is deposited across the nanoribbons and spacers, rather than certain ribbons nucleating faster than others. Adequately covering the nanoribbons across the device (e.g., each nanoribbon at different heights in a transistor) by the epitaxial source/drain deposits reduces source/drain leakage and short-channel effects from poorly-nucleated nanoribbons. Covering the spacers reduces the likelihood of shorts between the source or drain regions and the gate.

As noted above, in previous high-selectivity deposition processes, silicon facets along a (111) plane, leading to triangular nubs. The low-selectivity deposition and etch process described herein suppresses the (111) faceting; growth is instead substantially aligned with the (110) plane. In some embodiments, less than 25% of the silicon in the resulting source/drain regions may be aligned along the (111) crystal plane.

The etching process used to remove amorphous silicon may include germanium. The source and drain regions formed using the multicycle deposition and etch process may thus include a detectable trace of germanium left by the etching process, e.g., between 0.0001% and 2% germanium by weight.

The nanoribbon transistors described herein may be implemented in one or more components associated with an IC. In various embodiments, components associated with an IC include, for example, transistors, diodes, power sources, resistors, capacitors, inductors, sensors, transceivers, receivers, antennas, etc. Components associated with an IC may include those that are mounted on an IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value, unless specified otherwise. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0," each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide. The terms "oxide," "carbide," "nitride," etc. refer to compounds containing, respectively, oxygen, carbon, nitrogen, etc.

For convenience, if a collection of drawings designated with different letters are present, e.g., FIGS. 1A-1B, such a collection may be referred to herein without the letters, e.g., as "FIG. 1."

Example Nanoribbon Transistor

FIGS. 1A-1B illustrate an example architecture of a nanoribbon-based transistor. FIG. 1A is a cross-section across a transistor 100 showing the source, gate, and drain. FIG. 1B is a cross-section across the gate regions of the transistor 100. FIG. 1B is a cross-section through the plane AA' in FIG. 1A, and FIG. 1A is a cross-section through the plane BB' in FIG. 1B.

A number of elements referred to in the description of FIGS. 1A, 1B, and 3-13 with reference numerals are illustrated in these figures with different patterns, with a legend at the bottom of the page showing the correspondence between the reference numerals and patterns. The legend illustrates that FIGS. 1A and 1B use different patterns to show a support structure 102, a channel material 104, a dielectric material 106, a source or drain (S/D) contact 108, a gate electrode 110, an oxide 112, and a high-k dielectric 114.

In the drawings, some example structures of various devices and assemblies described herein are shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In general, implementations of the present disclosure may be formed or carried out on a support structure, e.g., the support structure 102 illustrated in FIG. 1. The support structure 102 may be, e.g., a substrate, a die, a wafer or a chip. For example, the support structure may be the wafer 1500 of FIG. 14A, discussed below, and may be, or be included in, a die, e.g., the singulated die 1502 of FIG. 14B, discussed below. The support structure 102 extends along the x-y plane in the coordinate system shown in FIG. 1.

In some embodiments, the support structure may be a substrate that includes silicon and/or hafnium. More generally, the support structure may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure may be a printed circuit board (PCB) substrate. Although a few examples of materials from which the substrate may be formed are described here, any material that may serve as a foundation upon which a semiconductor device including one or more nanoribbon transistors, as described herein, may be built falls within the spirit and scope of the present disclosure.

In FIGS. 1A and 1B, a transistor 100 is formed over a support structure 102. The transistor 100 includes a channel material 104 formed into four nanoribbons stacked on top of each other. The channel material 104 may be a semiconductor, such as silicon or other semiconductor materials described herein.

The transistor 100 includes nanoribbons 120*a*, 120*b*, 120*c*, and 120*d*, referred to collectively as nanoribbons 120 or individually as a nanoribbon 120. Each nanoribbon 120 is at a different height in the z-direction in the orientation shown in FIGS. 1A and 1B, i.e., a different distance from the support structure 102, where the nanoribbon 120*a* is the greatest distance from the support structure 102, and the nanoribbon 120*d* is the shortest distance from the support structure 102. S/D contacts 108*a* and 108*b* are formed at either end of the nanoribbon channels 120, as illustrated in FIG. 1A.

The S/D contacts 108 may be formed from one or more layers of doped semiconductors, metals, metal alloys, or other materials. In some embodiments described herein, the S/D contacts 108 may include a doped semiconductor, such as silicon or another semiconductor doped with an N-type dopant or a P-type dopant. In some embodiments, the S/D contacts 108 may include multiple layers with different levels of conductivity, e.g., a doped semiconductor followed by a more highly doped semiconductor, or a semiconductor followed by metal. In some embodiments, the S/D contacts 108 may be formed using a relatively low-selectivity epitaxial deposition process. An example process for forming the S/D contacts 108 is shown in FIG. 2 and further described with respect to FIGS. 3-13.

A central portion of each of the nanoribbon channels 120 is surrounded by a gate electrode 110. A gate dielectric surrounds the nanoribbon channels 120 under the gate electrodes 110. In this example, the gate dielectric around each nanoribbon channel 120 includes a layer of an oxide 112 and a layer of a high-k dielectric 114. The oxide 112 is grown directly on the nanoribbon channels 120, and the high-k dielectric 114 surrounds the oxide 112. Regions of the nanoribbon channels 120 not surrounded by the oxide 112, high-k dielectric 114, and gate electrode 110, or by an S/D contact 108, are filled in with a dielectric material 106.

As described above, previous methods for depositing the S/D contacts 108 used a high-selectivity process for growing the S/D material (e.g., silicon) on the channel material 104. The high-selectivity process results in lack of uniformity in the layers of the S/D material. In the process described below, a lower selectivity process is used, which can result in amorphous silicon growth. A multicycle deposition and etch process provides relatively uniform growth of crystalline silicon across the ends of the nanoribbons and across the dielectric spacers between the nanoribbons.

Example Process for Forming Source and Drain Regions in a Nanoribbon Transistor

FIG. 2 is a flowchart illustrating an example processing method 200 for fabricating source and drain regions of a nanoribbon-based transistor, according to some embodiments of the present disclosure. FIGS. 3-13 illustrate various steps in the processing method 200 of FIG. 2, according to some embodiments of the present disclosure. In general, the processing method 200 is performed across a wafer, with many individual transistors formed on the wafer. FIGS. 3-13 illustrate cross-sections of processing steps across several transistors. In some embodiments, the processing method 200 is used for forming N-type transistors. If a wafer includes N-type and P-type transistors, additional processing steps may be performed to fabricate source and drain regions for the P-type transistors. The processing method 200 describes a process of fabrication source and drain regions. Additional steps may be performed before and/or after the process 200 to produce a device that includes the source and drain regions described herein, e.g., to produce the nanoribbon transistor shown in FIG. 1.

At 202, a process for growing a channel material over a support structure is performed. To produce a stack of nanoribbons, the channel material may be grown in layers with a sacrificial material between layers of channel material. FIG. 3 is a cross-section illustrating layers of alternating materials 104 and 302 formed over a support structure 102, e.g., a substrate as described with respect to FIG. 1. The alternating materials 104 includes layers of the channel material 104 separated by layers of a sacrificial material 302. In general, to form nanoribbon channels, alternating layers of the channel material 104 and the sacrificial material 302 are deposited over the support structure 102. The channel material 104 and sacrificial materials 302 include different materials. In one example, the channel material 104 is silicon, while the sacrificial material 302 is a mixture of silicon and germanium. The sacrificial material 302 may be chosen to have a similar crystal structure to the channel material 104, so that monocrystalline layers of the channel material 104 (or substantially monocrystalline layers, e.g., with a grain size of at least 5 nanometers, at least 20 nanometers, at least 50 nanometers, or at least 100 nanometers) and monocrystalline layers of the sacrificial material 302 (or substantially monocrystalline layers) may be formed over each other. In different embodiments, the channel material 104 and/or the sacrificial material 302 may be formed of any suitable single-crystal material, such as sapphire, quartz, silicon, a compound of silicon (e.g., silicon oxide), indium phosphide, germanium or a germanium alloy (e.g., silicon germanium), gallium, arsenic (e.g., an arsenide III compound, where arsenic III is in combination with another element such as boron, aluminum, gallium, or indium), or any group III-V material (i.e., materials from groups III and V of the periodic system of elements).

More generally, the channel material 104 may be composed of semiconductor material systems including, for example, N-type or P-type materials systems. In other embodiments, the channel material 104 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. The channel material 104 may include one or more of cobalt oxide, copper oxide, ruthenium oxide, nickel oxide, niobium oxide, copper peroxide, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc.

In some embodiments, multiple channel materials may be included within an IC device. For example, an IC device may include both N-type metal-oxide-semiconductor (NMOS) transistors and P-type MOS (PMOS) transistors, e.g., alternating rows of NMOS and PMOS transistors. NMOS and PMOS logic can use different groups of channel material 104, e.g., silicon may be used to form an N-type semiconductor channel, while silicon germanium may be used to form a P-type semiconductor channel. In some embodiments, a single channel material 104 is used (e.g., silicon), and different portions (e.g., channel material to form different transistors) may include different dopants, e.g., N-type dopants for NMOS transistors and P-type dopants for PMOS transistors.

Returning to FIG. 2, at 204, a process to etch channel material to form regions for source and drains and deposit a dummy gate is performed. FIG. 4 illustrates the nanoribbon channel material 104 after stacks have been etched to form individuated channels for different transistors. For example, rows may be patterned using photolithography, and portions of the alternating layers are removed, leaving the stacks 410*a*, 410*b*, 410*c*, and 410*d* illustrated in FIG. 4. The stacks 410 are separated by etched regions 412*a*, 412*b*, and 412*c*, e.g., the etched region 412*a* is between the stacks 410*a* and 410*b*. In this example, a portion of the support structure 102 is also etched, so that the etched regions 412 extend into the support structure 102. The regions 412 are regions in which the source and drain regions for transistors are formed.

In the example shown in FIG. 4, the channel material 104 is formed into four nanoribbons stacked on top of each other. For example, the stack 410*b* includes nanoribbons 420*a*, 420*b*, 420*c*, and 420*d*. Each nanoribbon 420 is at a different height in the z-direction in the orientation shown in FIG. 4, i.e., a different distance from the support structure 102. Each of the stacks 410 has four nanoribbons. In other embodiments, the stacks 410, and transistors formed from the nanoribbon stacks, may each have fewer nanoribbons (e.g., one, two, or three nanoribbons), or more than four nanoribbons (e.g., five nanoribbons, six nanoribbons, etc.). The sacrificial material 302 is below the lowest nanoribbon 420*d* (i.e., between the support structure 102 and the nanoribbon 420*d*) and between adjacent nanoribbons (e.g., between nanoribbon 420*d* and 420*c*, between nanoribbon 420*c* and 420*b*, etc.).

The nanoribbons 420 each have an elongated structure that extends over the support structure 102. Each nanoribbon 420 extends primarily in the y-direction in the coordinate system used in FIGS. 3-13. The direction in which the nanoribbons 420 extend is parallel to the support structure 102; the nanoribbons 420 also extend in a direction parallel to the other nanoribbons in the stack.

As illustrated in FIG. 4, a dummy gate 414 is formed over each of the stacks 410, e.g., the dummy gate 414*a* is formed over the stack 410. The dummy gates 414 include a dummy gate material 402 and a gate spacer 404. At the processing stages illustrated in FIGS. 3-13, the transistor gate (e.g., the gate electrode 110) has not been formed; the dummy gates 414 and, in particular, the dummy gate material 402 is replaced with a gate stack later in the process. The gate spacer 404 may be included in a finished device, e.g., to electrically isolate the gate electrode from source or drain contacts formed on either side of the gate spacer 404. For example, the rounded top of the dummy gate 414 may be removed, and the dummy gate material 402 may be etched and replaced by a gate electrode 110, an oxide 112, and a high-k dielectric 114.

Further, at the stages illustrated in FIGS. 3-13, the layers of channel material 104 are supported by the alternating layers of sacrificial material 302. During gate formation, the sacrificial material 302 is removed, leaving the nanoribbons 420 "floating." After the sacrificial material 302 is removed, the gate stack may be deposited between the nanoribbons 420.

The dummy gate material 402 and the gate spacer 404 may each be a dielectric material. Suitable dielectric materials may include low-k or high-k dielectrics including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Returning to FIG. 2, at 206, spacers are deposited between the nanoribbons. FIG. 5 illustrates portions of an insulator material 502 deposited between adjacent nanoribbons 420 and below the lower-most nanoribbon in each stack (e.g., below nanoribbon 420*d*). The insulator material 502 forms spacers 510, each of which is next to a respective etched region 412 where a source or drain is formed. The spacers 510 may be referred to as dimple spacers or dimples. The spacers 510 of the insulator material 502 provide electrical isolation between the S/D regions and conductive materials (e.g., the gate electrode 110) that are later deposited between the nanoribbons 420. For example, the spacers 510*a*-510*d* are formed between nanoribbons 420*a*-420*d* and below the nanoribbon 420*d* in the stack 410*b* adjacent to the etched region 412*a*; another set of spacers is formed on the opposite side of the stack 410, adjacent to the etched region 412*b*. The insulator material 502 for forming the spacers 510 may include any suitable insulator material, e.g., any of the dielectric materials described above. In other embodiments, the shape of the spacers 510 may be different from that shown in FIG. 5.

At 208, silicon is deposited in the S/D regions. Silicon is an example of a first S/D material that is deposited in the regions etched at 204, e.g., using an epitaxial deposition process to grow a crystalline material over the exposed ends of the nanoribbon. A relatively low-selectivity process is used to grow a uniform layer of silicon, where the structure of different regions of the deposited silicon depends on the structure of the underlying surfaces on which the silicon grown. In particular, while the low-selectivity process grows crystalline silicon over the crystalline nanoribbons, the process deposits amorphous silicon over exposed dielectric areas, e.g., over the dimple spacers and gate spacers. The deposition process may involve co-flowing a silicon-based deposition precursor and a chlorine-based etch precursor into a deposition chamber, e.g., a CVD chamber. In some embodiments, disilane ($Si_2H_6$) is used as the silicon-based precursor; disilane results in conformal nucleation over both the silicon and dielectric surfaces, including over the spacers. By growing silicon over the spacers as well as the ends of the nanoribbons, (111)-facet formation is suppressed.

Figure 6B:
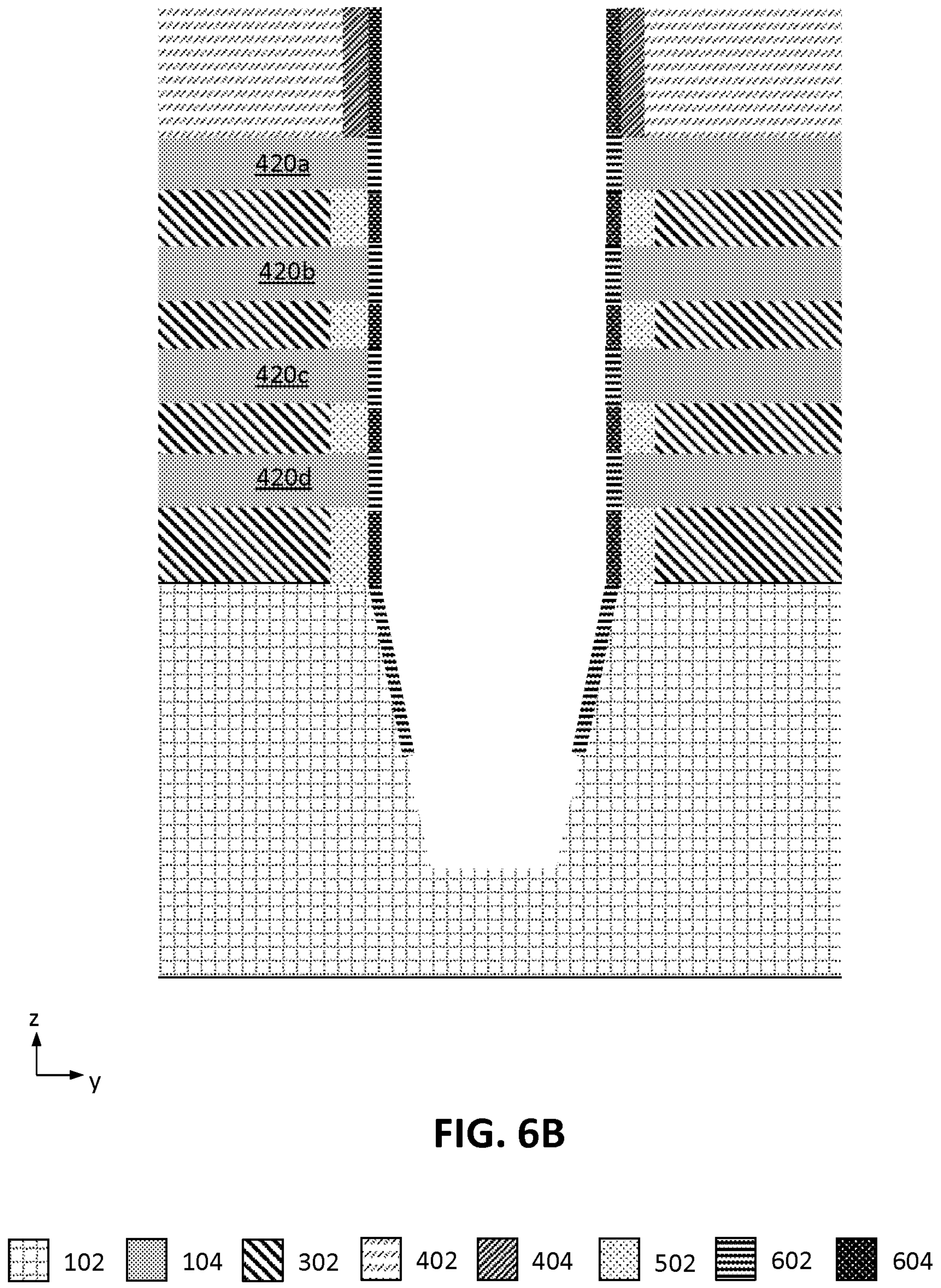
FIG. 6B is an enlarged view of a portion of FIG. 6A.

FIG. 6A is a cross-section illustrating deposition of a first layer of crystalline and amorphous silicon in the source/drain region, according to some embodiments of the present disclosure. Following the deposition process, a layer of crystalline silicon 602 is deposited over the exposed ends of the nanoribbons 420 and extends into the etched portions of the support structure 102, which in this example is a crystalline material (e.g., silicon). A layer of amorphous silicon 604 is deposited over non-crystalline materials, e.g., over the insulator material 502 for forming the spacers 510, and over the gate spacers 404. While the crystalline silicon 602 is illustrated as extending partially into the etched portions of the support structure 102, in different embodiments, the crystalline silicon 602 may extend farther or less far into these etched portions. The silicon 602 and 604 may include one or more dopants to increase the conductivity relative to pure silicon. For example, the silicon 602 may include N-dopants such as, for example, arsenic, phosphorus, or antimony. FIG. 6B is an enlarged view of a portion 620 of FIG. 6A. FIG. 6B more clearly shows the growth of the different silicon materials 602 and 604 over the nanoribbons 420 and the spacers 510.

Returning to FIG. 2, at 210, the amorphous silicon is etched. The etching process is a selective etch that removes amorphous silicon while leaving the crystalline silicon deposited over the ends of the nanoribbons substantially intact. In general, an etch process that removes the amorphous silicon at a higher etch rate than the crystalline silicon may be used. In some embodiments, hydrogen chloride (HCl) is used as the primary etchant. In some embodiments, germane ($GeH_4$) is used as a catalyst. Germane reacts with silicon to form SiGe, which can be etched away using HCl at a relatively low temperature. The germanium (Ge) may not be completely removed during the etch step, which may leave a detectable trace of germanium in the source/drain regions of a finished device, as described further below.

FIG. 7 is a cross-section illustrating a first selective etch of the amorphous silicon, according to some embodiments of the present disclosure. In FIG. 7, the amorphous silicon 604 present in FIG. 6 has been removed, while the regions of crystalline silicon 602 remain.

Returning to FIG. 2, at 212, the deposition process 208 and etch process 210 are repeated until a desired thickness of the crystalline silicon over the nanoribbons and spacers is achieved. For example, the deposition process 208 and etch process 210 may be repeated one, two, three, four, five, or more times. Each sequence of the deposition process 208 and etch process 210 may be referred to as a cycle. The number of cycles, and details of each cycle, may be tuned to obtain a desired result. For example, the length of the deposition process 208 (e.g., the amount of silicon deposited) and etch process 210 (e.g., the amount of silicon removed) in each cycle may be tuned or optimized. In some embodiments, the process specifications are selected to suppress (111)-faceting and/or the formation of triangular nubs. In some embodiments, the process specifications are selected to reduce an average or maximum thickness of the nucleation layer without running the risk of an exposed spacer. Reducing the thickness of the nucleation layer facilitates a larger volume of the source/drain to be filled by a higher-dopant layer.

FIGS. 8-11 illustrate intermediate results of two more deposition and etch cycles. FIG. 8 is a cross-section illustrating deposition of a second layer of crystalline and amorphous silicon over the first layer of crystalline silicon, according to some embodiments of the present disclosure. In FIG. 8, additional crystalline silicon 602 is grown over the crystalline silicon 602 remaining after the etch illustrated in FIG. 7. After the second deposition cycle, crystalline silicon 602 has expanded to cover a portion of the spacers 510, e.g., each region of crystalline silicon 602 over a nanoribbon 420 is expanding upwards and downwards (i.e., in both directions in the z-dimension in the coordinate system used). As in the prior deposition step, a layer of amorphous silicon 604 is deposited over dielectric regions, e.g., a central portion over each spacer 510, and over the gate spacer 404.

FIG. 9 is a cross-section illustrating a second selective etch of the amorphous silicon, according to some embodiments of the present disclosure. In FIG. 9, the amorphous silicon 604 present in FIG. 8 has been removed, while the regions of crystalline silicon 602 remain. The remaining regions of crystalline silicon 602 are larger after the second deposition and etch cycle (as illustrated in FIG. 9) than they were after the first deposition and etch cycle (as illustrated in FIG. 7).

FIG. 10 is a cross-section illustrating deposition of a third layer of crystalline and amorphous silicon over the second layer of crystalline silicon, according to some embodiments of the present disclosure. In FIG. 10, more crystalline silicon 602 is grown over the crystalline silicon 602 remaining after the etch illustrated in FIG. 9. At this point in the process, the crystalline silicon 602 has expanded to fully cover the spacers 510, e.g., each region of crystalline silicon 602 over a nanoribbon 420 has expanding upwards and downwards (i.e., in both directions in the z-dimension in the coordinate system used) to cover the full height of the spacers 510. As in the prior deposition step, a layer of amorphous silicon 604 is deposited over dielectric regions, e.g., over the gate spacer 404.

FIG. 11 is a cross-section illustrating a third selective etch of the amorphous silicon, according to some embodiments of the present disclosure. In FIG. 11, the amorphous silicon 604 present in FIG. 10 has been removed, while the regions of crystalline silicon 602 remain. The remaining regions of crystalline silicon 602 are larger after the third deposition and etch cycle (as illustrated in FIG. 11) than they were after the second deposition and etch cycle (as illustrated in FIG. 9). While three deposition and etch cycles are illustrated in FIGS. 6-11, as noted above, additional deposition and etch cycles may be needed to achieve the result illustrated in FIG. 11. As noted above, the regions of crystalline silicon 602 may not include pure silicon but, instead, may include one or more dopants and/or include other impurities, such as residual germanium, as described below.

Returning to FIG. 2, at 214, a higher-dopant source and drain material is deposited over the deposited crystalline silicon, and in particular, in the spaces between the layers of the deposited crystalline silicon. The higher-dopant source and drain may be deposited using an epitaxial deposition process to grow a crystalline material over an existing crystalline material, e.g., the previously deposited silicon. The higher-dopant source and drain material may be crystalline silicon with a higher dopant concentration. As noted above, the crystalline silicon 602 deposited in processes 208 and 212 may include one or more dopants to increase the conductivity relative to pure silicon; the material deposited in the process 214 may include a higher concentration of the dopant or dopants, or one or more different dopants. More generally, the material deposited in the process 214 may have a higher conductivity than the material deposited in the processes 208 and 212.

FIG. 12 is a cross-section illustrating growth of a second material for the sources and drains, according to some embodiments of the present disclosure. FIG. 12 illustrates that a second S/D material 1202 has been deposited in the spaces between the crystalline silicon 602, i.e., in the unfilled portions of the etched regions 412. The second S/D material 1202 forms an additional layer in the S/D region. For example, in the S/D region between the nanoribbon stacks 410*b* and 410*c*, moving left to right, there is a layer 1210*a* of crystalline silicon 602 (which may have a first dopant concentration), a layer 1212 of the second S/D material 1202 (which may be a crystalline silicon having a second, higher dopant concentration), and a layer 1210*b* of the crystalline silicon 602. These three layers together form the S/D region, e.g., one of the S/D contacts 108 shown in FIG. 1. This S/D region is shared by two transistors, each transistor formed around a respective nanoribbon stack 410*b* and 410*c*.

The second S/D material 1202 may include silicon. For example, the second S/D material 1202 may be crystalline silicon grown through epitaxial deposition. The second S/D material 1202 may include one or more dopants to increase the conductivity of the second S/D material 1202 relative to pure silicon. The dopants may be N-type dopants that include, for example, arsenic, phosphorus, or antimony. The second S/D material 1202 may have a higher concentration of dopants than the crystalline silicon 602, and the second S/D material 1202 may thus have a higher conductivity than the crystalline silicon 602.

As noted above, the etch process used to remove the amorphous silicon 604 may leave a detectable trace of in the source/drain regions of a finished device. The germanium may be detected in the layers 1210 of the crystalline silicon 602. For example, one or more of the layers 1210 may include at least 0.0001% germanium by weight. In some embodiments, the layers 1210 include between 0.0001% and 2% germanium by weight, or a value or range therein, e.g., between 0.001% and 2%, between 0.001 and 1%, between 0.1 and 2%, between 0.1% and 1%, or some other range or value of germanium by weight. The second S/D material 1202 in the central layer 1212 of the S/D region may not include germanium, or may include a lower concentration of germanium than the layers 1210. The deposition of the S/D material 1202 may not include a germanium etch step, so residual germanium may generally not be present in the layer 1212.

As a result of the multicycle deposition and etch process, the crystalline silicon 602 in the layers 1210 may be substantially aligned along a (110) crystal plane, where (110) refers to the Miller indices of a cubic crystal structure. For example, over 50% of the crystalline silicon 602 may be aligned along the (110) plane, or a greater percentage, e.g., at least 70%, at least 75%, at least 80%, at least 85%, at least 90%, or at least 95% of the crystalline silicon 602 may be aligned along the (110) plane. In the orientation shown in the figures, the silicon in the nanoribbons 420 is substantially aligned along a (100) crystal plane. The multicycle deposition and etch process suppresses growth of crystalline silicon 602 along the (111) plane compared to prior S/D deposition processes. For example, less than 25% of the crystalline silicon 602 may be aligned along the (111) plane, or a smaller percentage, e.g., less than 20% or less than 10% of the crystalline silicon 602 may be aligned along the (111) plane.

FIG. 13 is an enlarged view of the region 1230 in FIG. 12. FIG. 13 illustrates an S/D region between the nanoribbon stacks 410*b* and 410*c*, which includes the S/D layers 1210*a*, 1212, and 1210*b*, as shown in FIG. 12. FIG. 13 uses a different pattern 1302 from the prior figures to show the crystalline silicon 602, to make additional annotations on this figure clearer.

FIG. 13 illustrates thicknesses, also referred to as widths, at multiple parts of the crystalline silicon layer 1210*a*. The thickness at all heights along a silicon layer (e.g., the silicon layer 1210*a*) formed over the ends of the nanoribbons may be, for example, within 2 nanometers, within 1.5 nanometers, within 1 nanometers, within 0.8 nanometers, or within 0.5 nanometers. For example, the thickness 1330 of the silicon layer 1210*a* at the height of the uppermost nanoribbon 420*a* may be within 2 nanometers, within 1.5 nanometers, within 1 nanometers, within 0.8 nanometers, or within 0.5 nanometers of the thickness 1334 of the silicon layer 1210*a* at the height of the lowermost nanoribbon 420*d*. The silicon layers 1210 may generally be slightly thicker at the heights of the nanoribbons 420 than at the heights of the spacers 510, as illustrated. For example, the thickness 1334 along a portion of the silicon layer 1210*a* extending from a spacer 510 to the second S/D material 1202 is somewhat thinner than the thicknesses 1330 and 1332. In some embodiments, the thickness 1334 is within, for example, 2 nanometers, 1.5 nanometers, 1 nanometers, 0.8 nanometers, or 0.5 nanometers of the thicknesses 1330 and/or 1332.

As another example, if widths across multiple heights (e.g., 5 heights, 10 heights, 20 heights, etc.) of a given semiconductor layer (e.g., layer 1210*a*) are measured, a measurement of variation of the widths along a given layer may be within a particular range or below a particular threshold. For example, a standard deviation of widths measured across a given semiconductor layer (e.g., layer 1210*a*) may be below 3 nanometers, below 2 nanometers, below 1 nanometer, or below 0.5 nanometers. As another example, a range of widths (e.g., a difference between a maximum width and a minimum width of the layer 1210*a*) may be below 5 nanometers, below 2 nanometers, below 1 nanometer, etc.

Furthermore, each of the silicon layers 1210 is of substantially uniform thickness relative to the other silicon layers 1210. Thickness or width measurements across multiple layers (e.g., layers 1210*a* and 1210*b*) may be compared. For example, an average thickness of the layer 1210*a* may be within 3 nanometers, within 2 nanometers, within 1 nanometer, or within 0.5 nanometers of an average thickness of the layer 1210*b*. As another example, standard deviations of thicknesses across multiple semiconductor layers 1210 may be within a given range or tolerance, e.g., each standard deviation may be between 1 nanometers and 3 nanometers or between 0.5 nanometers and 2 nanometers, or each standard deviation may be below 3 nanometers, below 2 nanometers, or below 1 nanometer. A similar distribution of thicknesses across multiple S/D regions indicates uniform process control across a wafer or portion of a wafer.

FIG. 13 further illustrates an example seam 1340 present in the layer 1212 of the second S/D material 1202. The seam 1340 may be an artifact of the deposition process of the second S/D material 1202 is deposited. The second S/D material 1202 may build up over the layers 1210*a* and 1210*b*, and the second S/D material 1202 near the seam 1340 is the last of the second S/D material 1202 to be deposited in the layer 1212. The seam 1340 may include a relatively high concentration of a dopant material in the second S/D material 1202. For example, if the second S/D material 1202 is phosphorous-doped silicon, the seam 1340 may have a higher concentration of phosphorus than other portions of the second S/D material 1202 in the layer 1212.

Because the layers 1210 are substantially uniform, the seam in the S/D material 1202 deposited over the layers 1210 is substantially vertical in the orientation shown, e.g., extending substantially straight in the z-direction. Said another way, the seam 1340 extends in a direction perpendicular to the direction in which the nanoribbons 420 extend (i.e., the z-direction is perpendicular to the y-direction). In a cross-section through the stacks of nanoribbons (e.g., the cross-section through the stacks 410*b* and 410*c* shown in FIG. 13), the seam 1340 is a substantially straight line. For example, the seam 1340 may have a maximum deviation from a vertical line of no more than 1 nanometer, no more than 2 nanometers, no more than 3 nanometers, no more than 5 nanometers, no more than 10 nanometers.

Example Devices

The circuit devices with nanoribbon transistors with uniform source and drain epitaxial growth disclosed herein may be included in any suitable electronic device. FIGS. 14-17 illustrate various examples of apparatuses that may include the one or more transistors disclosed herein, which may have been fabricated using the processes disclosed herein.

Figure 14A:
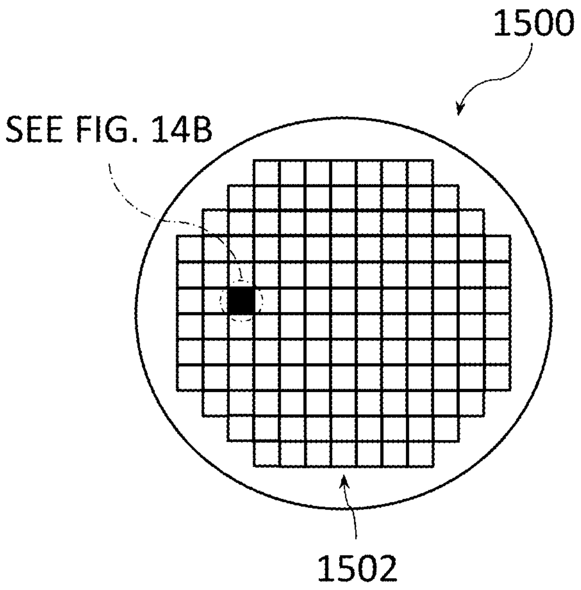
FIGS. 14A and 14B are top views of a wafer and dies that include one or more nanoribbon transistors with uniform source and drain epitaxial growth accordance with any of the embodiments disclosed herein.
Figure 14B:
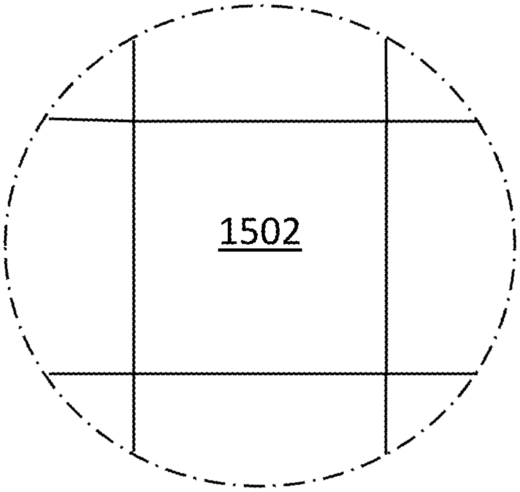

FIGS. 14A and 14B are top views of a wafer and dies that include one or more IC structures including one or more nanoribbon transistors with uniform source and drain epitaxial growth in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 2-14, or any further embodiments of the IC structures described herein). After the fabrication of the semiconductor product is complete (e.g., after manufacture of one or more IC structures with one or more of the transistors as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more of the transistors as disclosed herein may take the form of the wafer 1500 (e.g., not singulated) or the form of the die 1502 (e.g., singulated). The die 1502 may include one or more transistors (e.g., one or more of the transistors 1640 of FIG. 15, discussed below) and/or supporting circuitry to route electrical signals to the transistors, as well as any other IC components (e.g., one or more of the non-planar transistors described herein). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 17) or other logic that is configured to store information in the memory devices or execute instructions stored in the memory array.

Figure 15:
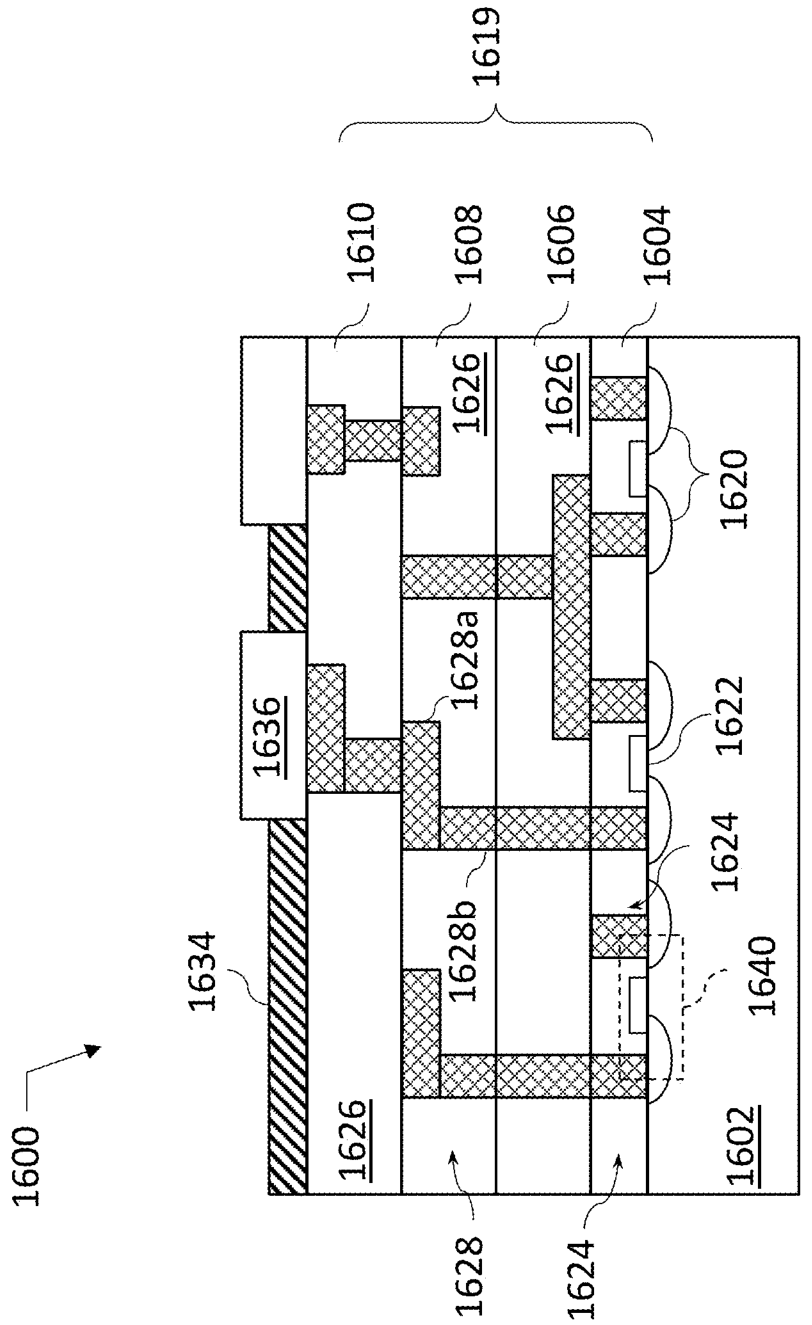
FIG. 15 is a cross-sectional side view of an IC device that may include one or more nanoribbon transistors with uniform source and drain epitaxial growth in accordance with any of the embodiments disclosed herein.

FIG. 15 is a cross-sectional side view of an IC device 1600 that may include one or more nanoribbon transistors with uniform source and drain epitaxial growth in accordance with any of the embodiments disclosed herein. The IC device 1600 may be formed on a substrate 1602 (e.g., the wafer 1500 of FIG. 14A) and may be included in a die (e.g., the die 1502 of FIG. 14B). The substrate 1602 may be any substrate as described herein. The substrate 1602 may be part of a singulated die (e.g., the dies 1502 of FIG. 14B) or a wafer (e.g., the wafer 1500 of FIG. 14A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 15 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The IC device 1600 may include one or more nanoribbon transistors with uniform source and drain epitaxial growth at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 15 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 15). Although a particular number of interconnect layers 1606-1610 is depicted in FIG. 15, embodiments of the present disclosure include IC devices having more or fewer interconnect layers than depicted.

In some embodiments, the interconnect structures 1628 may include trench contact structures **1628*a* (sometimes referred to as "lines") and/or via structures 1628*b* (sometimes referred to as "holes") filled with an electrically conductive material such as a metal. The trench contact structures 1628*a* may be arranged to route electrical signals in a direction of a plane that is substantially parallel with a surface of the substrate 1602 upon which the device layer 1604 is formed. For example, the trench contact structures 1628*a* may route electrical signals in a direction in and out of the page from the perspective of FIG. 15. The via structures 1628*b* may be arranged to route electrical signals in a direction of a plane that is substantially perpendicular to the surface of the substrate 1602 upon which the device layer 1604 is formed. In some embodiments, the via structures 1628*b* may electrically couple trench contact structures 1628*a* of different interconnect layers 1606-1610** together.

The interconnect layers 1606-1610 may include a dielectric material 1626 disposed between the interconnect structures 1628, as shown in FIG. 15. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures **1628*a* and/or via structures 1628*b*, as shown. The trench contact structures 1628*a* of the first interconnect layer 1606 may be coupled with contacts (e.g., the S/D contacts 1624) of the device layer 1604**.

A second interconnect layer 1608 (referred to as Metal 2 or "M2") may be formed directly on the first interconnect layer 1606. In some embodiments, the second interconnect layer 1608 may include via structures **1628*b* to couple the trench contact structures 1628*a* of the second interconnect layer 1608 with the trench contact structures 1628*a* of the first interconnect layer 1606. Although the trench contact structures 1628*a* and the via structures 1628*b* are structurally delineated with a line within each interconnect layer (e.g., within the second interconnect layer 1608) for the sake of clarity, the trench contact structures 1628*a* and the via structures 1628*b*** may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 16:
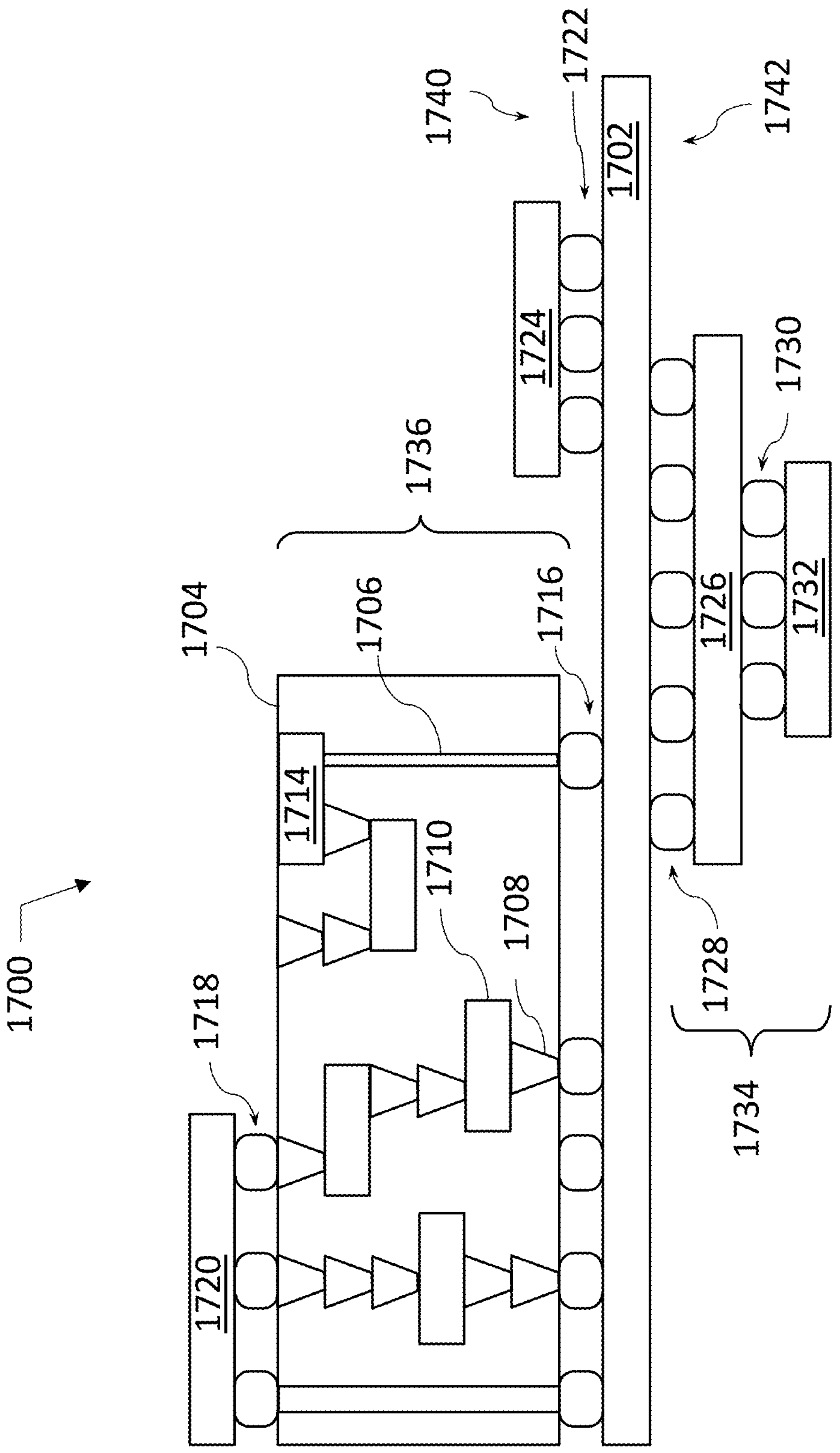
FIG. 16 is a cross-sectional side view of an IC device assembly that may include nanoribbon transistors with uniform source and drain epitaxial growth in accordance with any of the embodiments disclosed herein.

FIG. 16 is a cross-sectional side view of an IC device assembly 1700 that may include components having or being associated with (e.g., being electrically connected by means of) one or more nanoribbon transistors with uniform source and drain epitaxial growth in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include one or more of the non-planar transistors disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 16 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 16), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 16, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 14B), an IC device (e.g., the IC device 1600 of FIG. 15), or any other suitable component. In some embodiments, the IC package 1720 may include one or more nanoribbon transistors with uniform source and drain epitaxial growth, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 16, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 16 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 17:
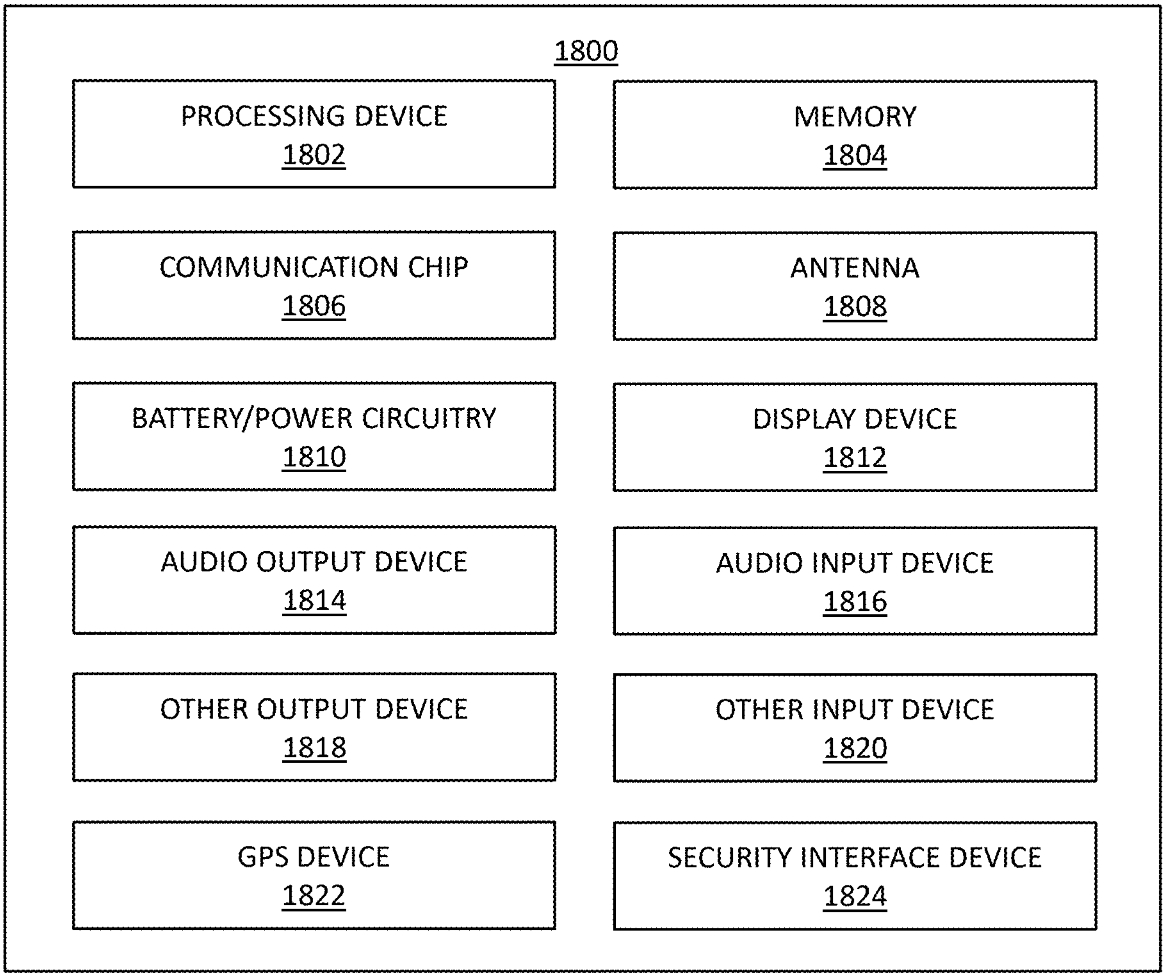
FIG. 17 is a block diagram of an example computing device that may include one or more nanoribbon transistors with uniform source and drain epitaxial growth in accordance with any of the embodiments disclosed herein.

FIG. 17 is a block diagram of an example computing device 1800 that may include one or more components including one or more nanoribbon transistors with uniform source and drain epitaxial growth in accordance with any of the embodiments disclosed herein. For example, any suitable ones of the components of the computing device 1800 may include a die (e.g., the die 1502 of FIG. 14B) having one or more transistors as described herein. Any one or more of the components of the computing device 1800 may include, or be included in, an IC device 1600 (FIG. 15). Any one or more of the components of the computing device 1800 may include, or be included in, an IC device assembly 1700 (FIG. 16).

A number of components are illustrated in FIG. 17 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides an IC device that includes a support structure; a plurality of elongated structures arranged in a stack, each elongated structure in the stack extending in a direction parallel to other elongated structures in the stack, each of the plurality of elongated structures having a first end and a second end opposite the first end; and a source or drain region coupled to the first ends of the plurality of elongated structures, the source or drain region including silicon substantially aligned along a (110) crystal plane.

Example 2 provides the IC device of example 1, where less than 25% of silicon in the source or drain region is aligned along a (111) crystal plane.

Example 3 provides the IC device of example 1 or 2, where the source or drain region is a first layer of a source or drain region having a first concentration of dopant, the IC device further including a second layer of the source of drain region having a second concentration of dopant greater than the first concentration.

Example 4 provides the IC device of example 3, where the first layer has a thickness in a direction parallel to the elongated structures, where a variation of the thickness between an uppermost elongated structure in the stack and a lowermost elongated structure in the stack is less than 2 nanometers.

Example 5 provides the IC device of example 3 or 4, where at least 75% of silicon crystal structures in the first layer are aligned along a (110) crystal plane.

Example 6 provides the IC device of any of the preceding examples, where the elongated structures include silicon substantially aligned along a (100) crystal plane.

Example 7 provides an IC device that includes a support structure; a plurality of elongated structures arranged in a stack, each elongated structure in the stack extending in a direction parallel to other elongated structures in the stack, each of the plurality of elongated structures having a first end and a second end opposite the first end, the elongated structures including silicon; and a source or drain region coupled to the first ends of the plurality of elongated structures, the source or drain region including at least 0.0001% germanium by weight.

Example 8 provides the IC device of example 7, where the source or drain region includes between 0.001% and 2% germanium by weight.

Example 9 provides the IC device of example 7 or 8, where the source or drain region further includes monocrystalline silicon.

Example 10 provides the IC device of example 9, where the source or drain region further includes phosphorous.

Example 11 provides the IC device of any of examples 7-10, where a first concentration of germanium at a first portion of the source or drain region is greater than a second concentration of germanium at a second portion of the source or drain region, the first portion closer to the support structure than the second portion.

Example 12 provides the IC device of any of examples 7-10, where the germanium is present in a first portion of the source or drain region, the first portion closer to the first ends of the plurality of elongated structures than a second portion.

Example 13 provides the IC device of example 12, further including a second plurality of elongated structures arranged in a stack, the second plurality of elongated structures coupled to the second portion of the source or drain region, a third portion of the source or drain region between the first portion and the second portion.

Example 14 provides the IC device of example 13, where germanium is present in the second portion, and germanium is not present in the third portion.

Example 15 provides an IC device that includes a first plurality of nanoribbons arranged in a first stack, each nanoribbon in the first stack extending in a direction parallel to other nanoribbons in the first stack; a second plurality of nanoribbons arranged in a second stack, each nanoribbon in the second stack extending in a direction parallel to nanoribbons in the first stack and to other nanoribbons in the second stack; and a source or drain region between the first plurality of nanoribbons and the second plurality of nanoribbons, the source or drain region having a first layer coupled to the first plurality of nanoribbons, a second layer coupled to the second plurality of nanoribbons, and a third layer between the first layer and the second layer; where the first layer has a thickness variation in the direction parallel to the nanoribbons in the first stack of less than 2 nanometers.

Example 16 provides the IC device of example 15, where the thickness variation is less than 1 nanometer.

Example 17 provides the IC device of example 15 or 16, where the third layer has a greater concentration of a dopant than the first layer and the second layer.

Example 18 provides the IC device of example 17, where the third layer has a seam in a direction perpendicular to the nanoribbons in the first stack, the seam including a greater concentration of the dopant.

Example 19 provides the IC device of example 18, where a cross-section of the seam in a plane through the first stack of nanoribbons and the second stack of nanoribbons is a substantially straight line.

Example 20 provides the IC device of any of examples 15-19, where the first layer and the second layer include germanium.

Example 21 provides an IC package that includes an IC die, including one or more of the IC devices according to any one of the preceding examples. The IC package may also include a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an IC die coupled to the circuit board, where the IC die includes one or more of the transistor/IC devices according to any one of the preceding examples (e.g., transistor/IC devices according to any one of examples 1-20), and/or the IC die is included in the IC package according to any one of the preceding examples (e.g., the IC package according to any one of examples 21-24).

Example 26 provides the computing device according to example 25, where the computing device is a wearable computing device (e.g., a smart watch) or hand-held computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device comprising:

a support structure;

a plurality of elongated structures arranged in a stack, each elongated structure in the stack extending in a direction parallel to other elongated structures in the stack, each of the plurality of elongated structures having a first end and a second end opposite the first end; and a source or drain region coupled to the first ends of the plurality of elongated structures, the source or drain region comprising:

a first layer comprising silicon substantially aligned along a (110) crystal plane, wherein less than 25% of the silicon in the first layer is aligned along a (111) crystal plane, and the silicon substantially aligned along the (110) crystal plane is a continuous layer over the first ends of the plurality of elongated structures and spacers between the first ends; and a second layer, the first layer between the first ends of the plurality of elongated structures and the second layer.

2. The IC device of claim 1, wherein less than 25% of silicon in the source or drain region is aligned along a (111) crystal plane.

3. The IC device of claim 1, wherein the first layer of the source or drain region has a first concentration of dopant, and the second layer of the source or drain region has a second concentration of dopant greater than the first concentration.

4. The IC device of claim 1, wherein the first layer has a thickness in a direction parallel to the elongated structures, wherein a variation of the thickness between an uppermost elongated structure in the stack and a lowermost elongated structure in the stack is less than 2 nanometers.

5. The IC device of claim 1, wherein at least 75% of silicon crystal structures in the first layer are aligned along a (110) crystal plane.

6. The IC device of claim 1, wherein the elongated structures comprise silicon substantially aligned along a (100) crystal plane.

7. The IC device of claim 1, wherein the silicon substantially aligned along the (110) crystal plane in the first layer is directly adjacent to one of the spacers.

8. An integrated circuit (IC) device comprising:

a support structure;

a plurality of elongated structures arranged in a stack, each elongated structure in the stack extending in a direction parallel to other elongated structures in the stack, each of the plurality of elongated structures having a first end and a second end opposite the first end, the elongated structures comprising silicon; and a source or drain region coupled to the first ends of the plurality of elongated structures, the source or drain region comprising:

a first layer comprising between 0.0001% and 2% germanium by weight; and a second layer comprising silicon and less than 0.0001% germanium by weight, wherein the first layer is between the first ends of the plurality of elongated structures and the second layer.

9. The IC device of claim 8, wherein the second layer of the source or drain region comprises monocrystalline silicon.

10. The IC device of claim 9, wherein the source or drain region further comprises phosphorus.

11. The IC device of claim 9, further comprising a second plurality of elongated structures arranged in a stack, the second plurality of elongated structures coupled to a third layer of the source or drain region, wherein the second layer of the source or drain region is between the first layer and the third layer.

12. The IC device of claim 11, wherein germanium is present in the third layer.

13. The IC device of claim 8, wherein the second layer of the source or drain region comprises substantially no germanium.

14. The IC device of claim 8, wherein less than 25% of the silicon in the first layer of the source or drain region is aligned along a (111) crystal plane.

15. An integrated circuit (IC) device comprising:

a first plurality of nanoribbons arranged in a first stack, each nanoribbon in the first stack extending in a direction parallel to other nanoribbons in the first stack;

a second plurality of nanoribbons arranged in a second stack, each nanoribbon in the second stack extending in a direction parallel to nanoribbons in the first stack and to other nanoribbons in the second stack; and a source or drain region between the first plurality of nanoribbons and the second plurality of nanoribbons, the source or drain region having a first layer comprising silicon coupled to the first plurality of nanoribbons, a second layer coupled to the second plurality of nanoribbons, and a third layer between the first layer and the second layer;

wherein the first layer is a continuous layer over the first plurality of nanoribbons and spacers between the first plurality of nanoribbons, less than 25% of the silicon in the first layer is aligned along a (111) crystal plane, and the first layer has a thickness variation in the direction parallel to the nanoribbons in the first stack of less than 2 nanometers.

16. The IC device of claim 15, wherein the thickness variation is less than 1 nanometer.

17. The IC device of claim 15, wherein the third layer has a greater concentration of a dopant than the first layer and the second layer.

18. The IC device of claim 17, wherein the third layer has a seam in a direction perpendicular to the nanoribbons in the first stack, the seam comprising a greater concentration of the dopant.

19. The IC device of claim 18, wherein a cross-section of the seam in a plane through the first stack of nanoribbons and the second stack of nanoribbons is a substantially straight line.

20. The IC device of claim 15, wherein the first layer and the second layer comprise germanium.

* * * * *